(12) United States Patent
Kim et al.

(10) Patent No.: US 11,222,938 B2
(45) Date of Patent: Jan. 11, 2022

(54) DISPLAY APPARATUS WITH ORGANIC FILLER DISPOSED IN GROOVE

(71) Applicant: SAMSUNG DISPLAY CO., LTD., Yongin-si (KR)

(72) Inventors: Jaeneung Kim, Yongin-si (KR); Changyong Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 8 days.

(21) Appl. No.: 16/824,846

(22) Filed: Mar. 20, 2020

(65) Prior Publication Data

US 2020/0303479 A1    Sep. 24, 2020

(30) Foreign Application Priority Data

Mar. 20, 2019 (KR) ........................ 10-2019-0031775

(51) Int. Cl.
| | |
|---|---|
| *H01L 29/08* | (2006.01) |
| *H01L 27/32* | (2006.01) |
| *H01L 51/52* | (2006.01) |
| *G09G 3/3225* | (2016.01) |
| *H01L 51/00* | (2006.01) |

(52) U.S. Cl.
CPC ....... *H01L 27/3258* (2013.01); *G09G 3/3225* (2013.01); *H01L 27/3262* (2013.01); *H01L 27/3265* (2013.01); *H01L 27/3276* (2013.01); *H01L 51/0097* (2013.01); *H01L 51/5253* (2013.01); *G09G 2380/02* (2013.01); *H01L 2251/5338* (2013.01)

(58) Field of Classification Search
CPC ............. H01L 27/3258; H01L 27/3262; H01L 27/3276; H01L 51/0097; G09G 3/3225
See application file for complete search history.

(56) References Cited

U.S. PATENT DOCUMENTS

| | | | |
|---|---|---|---|
| 8,330,257 B2 | 12/2012 | Moon et al. | |
| 8,415,666 B2 | 4/2013 | Huh et al. | |
| 8,789,984 B2 | 7/2014 | Lee et al. | |
| 9,570,534 B2 | 2/2017 | Cho et al. | |
| 10,014,172 B2 | 7/2018 | Ahn et al. | |
| 2017/0053971 A1* | 2/2017 | Sato .................... | H01L 51/5275 |
| 2017/0148856 A1* | 5/2017 | Choi .................... | H01L 51/0096 |
| 2017/0194599 A1* | 7/2017 | Furuie .................. | H01L 51/5253 |

(Continued)

FOREIGN PATENT DOCUMENTS

| | | |
|---|---|---|
| KR | 10-1182232 | 9/2012 |
| KR | 10-1488925 | 2/2015 |

(Continued)

*Primary Examiner* — Phuc T Dang
(74) *Attorney, Agent, or Firm* — F. Chau & Associates, LLC

(57) ABSTRACT

A display apparatus includes a substrate including a display area having a plurality of pixel circuits that are spaced apart from each other. An inorganic material layer is arranged in the display area and includes a groove between adjacent pixel circuits of the plurality of pixel circuits. An organic filler is disposed in the groove. The inorganic material layer includes at least one insulating material layer and an etch stop layer. The etch stop layer includes a semiconductor material or a conductive material. The etch stop layer is provided on a bottom surface or a portion of a side wall of the groove.

20 Claims, 13 Drawing Sheets

(56) References Cited

U.S. PATENT DOCUMENTS

2019/0041915 A1* 2/2019 Park .................... H01L 27/3262
2019/0148476 A1 5/2019 Park et al.

FOREIGN PATENT DOCUMENTS

| KR | 10-1516415 | 5/2015 |
| KR | 10-2015-0105533 | 9/2015 |
| KR | 10-2016-0035171 | 3/2016 |
| KR | 10-1812065 | 12/2017 |
| KR | 10-2019-0055868 | 5/2019 |

* cited by examiner

DISPLAY APPARATUS WITH ORGANIC FILLER DISPOSED IN GROOVE

CROSS-REFERENCE TO RELATED APPLICATION

This application claims priority under 35 U.S.C § 119 to Korean Patent Application No. 10-2019-0031775, filed on Mar. 20, 2019, in the Korean Intellectual Properly Office, the disclosure of which is incorporated by reference in its entirety herein.

TECHNICAL FIELD

Exemplary embodiments relate to a display apparatus.

DISCUSSION OF RELATED ART

A display apparatus typically includes a display device and a plurality of electronic devices for controlling an electrical signal applied to the display device. The electronic devices may include a thin film transistor (TFT), a storage capacitor, and a plurality of wirings.

The amount of thin film transistors that are electrically connected to a display device and the number of wirings transmitting an electric signal to the thin film transistors may be increased to precisely control the emission or non-emission of the display device and the degree of the emission thereof. Accordingly, there has been a significant amount of research performed with respect to achieving a high integration of a display apparatus and reducing errors thereby.

SUMMARY

One or more exemplary embodiments provide a display apparatus that is strong to external shock and flexible.

Additional aspects will be set forth in part in the description which follows and, in part, will be apparent from the description, or may be learned by practice of the presented embodiments.

According to one or more exemplary embodiments, a display apparatus includes a substrate including a display area having a plurality of pixel circuits that are spaced apart from each other. An inorganic material layer is arranged in the display area and includes a groove between adjacent pixel circuits of the plurality of pixel circuits. An organic filler is disposed in the groove. The inorganic material layer includes at least one insulating material layer and an etch stop layer. The etch stop layer includes 2 semiconductor material or a conductive material. The etch stop layer is provided on a bottom surface or a portion of a side wall of the groove.

In an exemplary embodiment, the plurality of pixel circuits each include a thin film transistor including a semiconductor layer and a gate electrode, and the etch stop layer may be provided on a same layer as the semiconductor layer and include a same material as that of the semiconductor layer.

In an exemplary embodiment, the plurality of pixel circuits each include a thin film transistor including a semiconductor layer and a gate electrode, and the etch stop layer may be provided on a same layer as the gate electrode and include a same material as that of the gate electrode.

In an exemplary embodiment, the plurality of pixel circuits may each include a driving thin film transistor and a storage capacitor. The driving thin film transistor and the storage capacitor may be arranged to overlap each other, and the etch stop layer may be provided on a same layer as an electrode of the storage capacitor and include a same material as that of the electrode of the storage capacitor.

In an exemplary embodiment, the inorganic material layer may include a barrier layer arranged on the substrate, and the barrier layer may be continuously arranged over the plurality of pixel circuits.

In an exemplary embodiment, the organic filler may be arranged to surround at least a portion of the plurality of pixel circuits.

In an exemplary embodiment, the organic filler may extend to an upper surface of the inorganic material layer.

In an exemplary embodiment, the display apparatus may further include a first connection wiring that overlaps the plurality of pixel circuits and is arranged on the organic filler.

In an exemplary embodiment, the adjacent pixel circuits include a first pixel circuit and a second pixel circuit that are adjacent to each ether in a first direction. A first scanning line of the first pixel circuit is separated from a second scanning line of the second pixel circuit by the organic filler. The first scanning line and the second scanning line are connected to each other by the first connection wiring.

In an exemplary embodiment, an elongation rate of the first connection wiring may be greater than an elongation rate of the scanning line.

In an exemplary embodiment, the display apparatus may further include an interlayer insulating layer covering the first connection wiring; and a second connection wiring arranged on the interlayer insulating layer and connects the plurality of pixel circuits to each other.

In an exemplary embodiment, the first connection wiring and the second connection wiring may respectively extend in different directions.

In an exemplary embodiment, the insulating material layer may be etched by a fluoride-based gas, and the etch stop layer may be etched by a chloride-based gas.

In an exemplary embodiment, the display apparatus may further include an encapsulation layer that seals the display area and includes at least one inorganic encapsulation layer and at least one organic encapsulation layer.

According to an exemplary embodiment of the present inventive concepts, a display apparatus includes a substrate including a display area having a plurality of pixel circuits that are spaced apart from each other. An inorganic material layer is arranged in the display area and includes a groove in an area between adjacent pixel circuits of the plurality of pixel circuits. An organic filler is disposed in the groove. A recess is positioned on a side wall of the groove.

In an exemplary embodiment, the inorganic material layer may include a barrier layer arranged on the substrate, and the barrier layer may be arranged under the groove and continuously arranged over the plurality of pixel circuits.

In an exemplary embodiment, the organic filler may be arranged to surround at least a portion of the plurality of pixel circuits.

In an exemplary embodiment, the display apparatus may further include a first connection wiring that overlaps the plurality of pixel circuits and arranged on the organic filler.

In an exemplary embodiment, the adjacent pixel circuits include a first pixel circuit and a second pixel circuit that are adjacent to each other in a first direction. A first scanning line of the first pixel circuit is separated from a second scanning line of the second pixel circuit by the organic filler. The first scanning line and the second scanning line are connected to each other by the first connection wiring.

In an exemplary embodiment, an elongation ratio of the first connection wiring may be greater than an elongation ratio of the scanning line.

In another exemplary embodiment of the present inventive concepts, a method for manufacturing a display apparatus having a plurality of pixel circuits includes forming a lower inorganic material layer on a substrate, the lower inorganic material layer including a barrier layer. An etch stop layer is formed on the lower inorganic material layer. The etch stop layer has a first etching condition. An upper inorganic material layer is formed on the etch stop layer. The upper inorganic material layer has a different etching condition than the etch stop layer. A first etching process is performed on a region of the upper inorganic material layer between adjacent pixel circuits of the plurality of pixel circuits to form a first opening in the upper inorganic material layer. A second etching process is performed on a region of the etch stop layer between the adjacent pixel circuits to form a second opening in the etch stop layer. A third etching process is performed on a region of the lower inorganic material layer between the adjacent pixel circuits to form a third opening in the lower inorganic material layer, the third opening exposing the barrier layer. The first opening, second opening and third opening form a groove. An organic filler is formed in the groove.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF THE EXEMPLARY EMBODIMENTS

Figure 1:
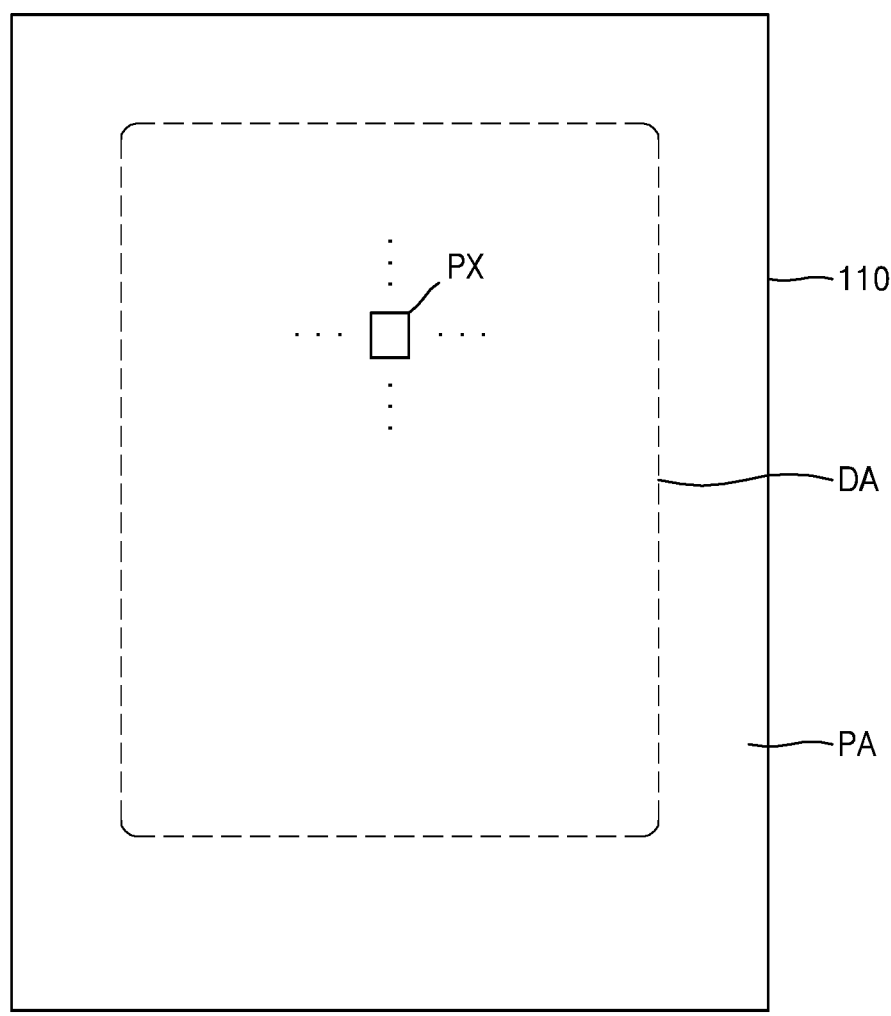
FIG. 1 is a top plan view showing a display apparatus according to an exemplary embodiment of the present inventive concepts.
Figure 1:
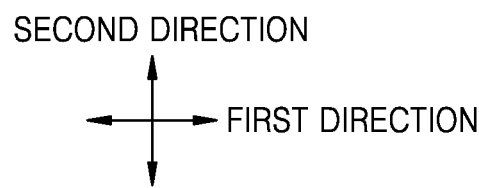

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments of the present inventive concepts will be described more fully with reference to the accompanying drawings. Like reference numerals denote like or corresponding elements, and thus their description will be omitted.

In the exemplary embodiments set forth herein, terms such as "first," "second" and so on are used to distinguish one component from another, and are not intended to limit the components.

In the exemplary embodiments, an expression used in the singular encompasses the expression of the plural, unless it has a clearly different meaning in the context.

In the exemplary embodiments, terms such as "including," "having" are intended to indicate the existence of the features or components thereof disclosed in the specification, and are not intended to preclude the possibility that one or more other features or components may exist or may be added.

In the exemplary embodiments, when a layer, a region, or a component and the like are referred to as being "on" (e.g., disposed on, arranged on, located on, etc.) another layer, region, or component, the layer, region, or the component may be directly on the other layer, region, component or an intervening layer, region, or component may be present therebetween.

Sizes of components in the drawings may be exaggerated for convenience of explanation. In other words, since the sizes and thicknesses of components in the drawings may be arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

In following exemplary embodiments, when a layer, region, or component is connected to another layer, region, or component, the layer, region, or component may be directly connected to the other layer, region, or component, or may be indirectly connected to the other layer, region, or component and another layer, region, or component may be disposed therebetween. For example, in the specification, when a layer, region, or component is electrically connected to another layer, region, or component, the layer, region, or component may be electrically connected in a direct manner to the other layer, region, or component or electrically connected in an indirect manner to the other layer, region, or component having another layer, region, or component therebetween.

FIG. 1 is a top plan view showing a display apparatus according to an exemplary embodiment of the present inventive concepts.

Referring to FIG. 1, pixels PX including various kinds of display devices, such as an organic light-emitting device (OLED), may be arranged in a display area DA of a substrate 110. Various kinds of wirings for providing an electric signal to the display area DA may be located in a peripheral area PA of the substrate 110. Hereinafter, for convenience of explanation, a display apparatus including an OLED as a display device is described. However, exemplary embodiments of the present inventive concepts are not limited thereto. For example, the present inventive concepts may be applied to various types of display apparatuses, such as a liquid crystal display apparatus, an electrophoretic display apparatus, inorganic EL display apparatuses, etc.

Figure 2:
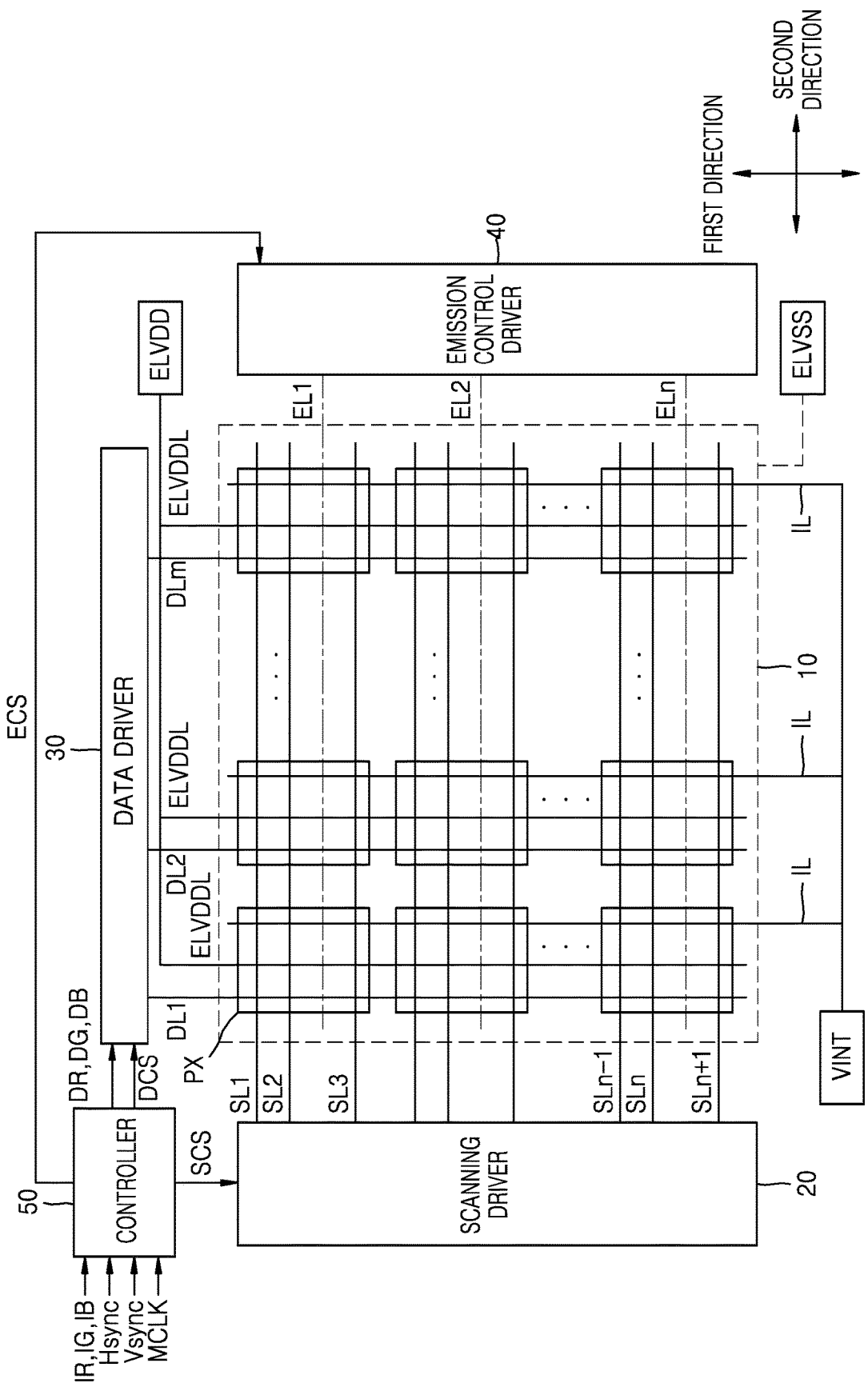
FIG. 2 is a block diagram showing a display apparatus according to an exemplary embodiment of the present inventive concepts.

FIG. 2 is a block diagram showing a display apparatus according to an exemplary embodiment of the present inventive concepts.

Referring to FIG. 2, the display apparatus according to an exemplary embodiment includes a display unit 10 which includes a plurality of pixels PX, a scanning driver 20, a data driver 30, an emission control driver 40, and a controller 50.

The display unit 10 is arranged in a display area DA and includes a plurality of pixels PX that are located at intersections of a plurality of scanning lines SL1 through SLn+1, a plurality of data lines DL1 through DLm, and a plurality of emission control lines EL1 through SLn that are arranged approximately in the form of a matrix. The plurality of scanning lines SL1 through SLn+1 and the plurality of emission control lines EL1 through ELn extend in a second direction that is a row direction and are arranged in a first direction that is a column direction. The plurality of data lines DL1 through DLm and a driving voltage line ELVDDL extend in the first direction and are arranged in the second direct on. "n" and "m" are natural numbers. However, in a pixel line, an n value of the plurality of scanning lines SN1 through SLn+1 may be different from an n value of the plurality of emission control lines EL1 through ELn. Furthermore, in other exemplary embodiments, the scanning lines, data lines and emission control lines may have various different arrangements.

In the exemplary embodiment shown in FIG. 2, each pixel PX is connected to three scanning lines from among the plurality of scanning lines SL1 through SLn+1. The scanning driver 20 generates three scanning signals and provides the three scanning signals to each pixel PX through the plurality of scanning lines SL1 through SLn+1. The scanning driver 20 may sequentially provide the scanning signals to scanning lines SL2 through SLn, the previous scanning lines SL1 through SLn−1, or the next scanning lines SL3 through SLn+1.

An initialization voltage line IL may receive an initialization voltage that is applied from an external power supply source VINT and provide the initialization voltage to each pixel PX.

In addition, each pixel PX is connected to a data line from among the plurality of data lines DL1 through DLm. Each pixel PX is also connected to an emission control line from among the plurality of emission control lines EL1 through ELn.

The data driver 30 provides a data signal to each pixel PX through the plurality of data lines DU through DLm. Each time a scanning signal is supplied to the first scanning lines SL2 through SLn, the data signal is supplied to a pixel selected by the scanning signal.

The emission control driver 40 generates an emission control signal and provides the emission control signal to each pixel PX through the plurality of emission control lines EL1 through ELn. The emission control signal controls an emission time period of the pixel PX. However, in certain exemplary embodiments, the emission control driver 40 may be omitted according to an internal structure of the pixel PX.

The controller 50 changes a plurality of image signals IR, IG, and IB into a plurality of image data signals DR, DG, and DB and provides the image data signals DR, DG, and DB to the data driver 30. In addition, the controller 50 receives a vertical synchronization signal Vsync, a horizontal synchronization signal Hsync, and a clock signal MCLK and generates control signals to control operations of the scanning driver 20, the data driver 30, and the emission control driver 40. The controller 50 provides the control signals respectively to the scanning driver 20, the data driver 30, and the emission control driver 40. For example, the controller 50 generates and provides a scanning driving control signal SCS to control the scanning driver 20, a data driving control signal DCS to control the data driver 30, and an emission driving control signals ECS to control the emission control driver 40.

Each of the plurality of pixels PX receives a driving power voltage ELVDD and a common power voltage ELVSS from outside (e.g., an external device). The driving power voltage ELVDD may be a high level voltage, and the common power voltage ELVSS may be a voltage that is lower than the driving power village ELVDD, or a ground voltage. The driving power voltage ELVDD is supplied to each pixel PX through the driving power line ELVDDL.

Each of the plurality of pixels PX emits light having a certain luminance by a driving current that is supplied to the display device in response to the data signal provided through the plurality of data lines DL1 through DLm.

Figure 3:
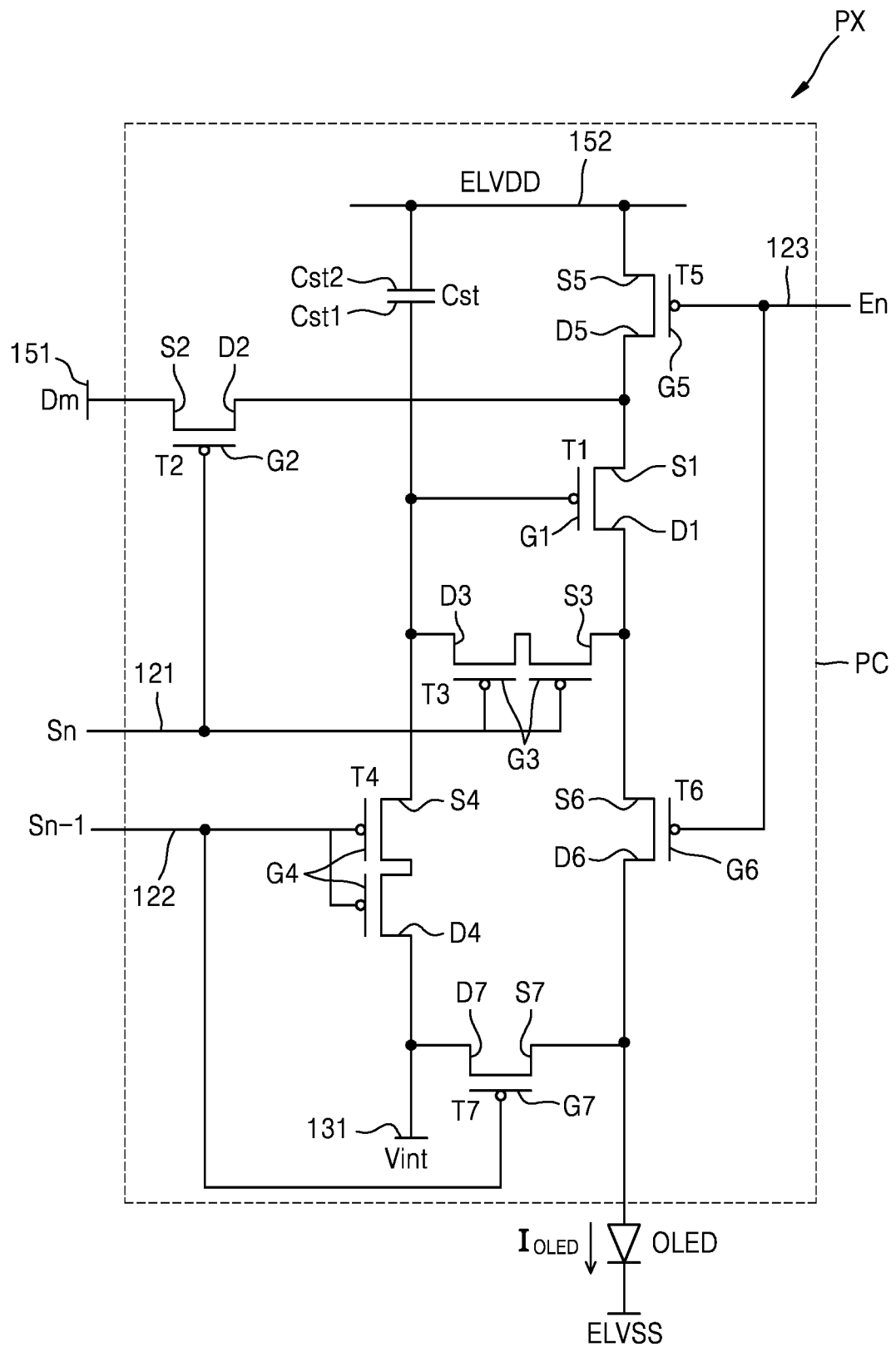
FIG. 3 is an equivalent circuit diagram of a pixel provided in a display apparatus according to an exemplary embodiment of the present inventive concepts.

FIG. 3 is an equivalent circuit diagram of a pixel provided in a display apparatus according to an exemplary embodiment of the present inventive concepts.

Referring to FIG. 3, each pixel PX includes signal lines including a scanning line 121, a previous scanning line 122, the emission control line 123, and a data line 151. Each pixel PX also includes an initialization voltage line 131, a pixel circuit PC connected to a driving voltage line 152 and a display device, for example, an organic light-emitting diode OLED that is connected to the pixel circuit PC.

The pixel circuit PC includes a plurality of thin film transistors T1, T2, T3, T4, T5, T6, and T7 and a storage capacitor Cst.

FIG. 3 shows an exemplary embodiment in which the signal lines, the initialization voltage line 131, and the driving voltage line 152 are provided in each pixel PX. However, exemplary embodiments of the present inventive concepts are not limited thereto. For example, in another exemplary embodiment, at least one of the signal lines, and/or the initialization voltage line 131 may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scanning line 121 that provides a scanning signal Sn, the previous scanning line 122 that provides a previous scanning signal Sn−1 to the first initialization thin film transistor T4 and the second initialization thin film transistor T7, the emission control line 123 that provides an emission control signal En to the operation control thin film transistor T5 and the emission control thin film transistor T6, and the data line 151 that intersects with the scanning line 121 and provides a data signal Dm. The driving voltage line 152 provides a driving power voltage ELVDD to the driving thin film transistor T1, and the initialization voltage line 131 delivers an initialization voltage Vint that initializes the driving thin film transistor T1 and a pixel electrode.

A driving gate electrode G1 of the driving thin film transistor T1 is connected to a first electrode Cst1 of the storage capacitor Cst. A driving source electrode S1 of the driving thin film transistor T1 is connected to the driving voltage line 152 via the operation control thin film transistor T5. A driving drain electrode D1 of the driving thin film transistor T1 is electrically connected to a pixel electrode of the organic light-emitting device OLED via the emission control thin film transistor T6. The driving thin film transistor T1 receives the data signal Dm in response to a switching operation of the switching thin film transistor T2 and supplies a driving current $I_{OLED}$ the organic light-emitting device OLED.

A switching gate electrode G2 of the switching thin film transistor T2 is connected to the scanning line 121. A switching source electrode S2 of the switching thin film transistor T2 is connected to the data line 151. A switching drain electrode D2 of the switching thin film transistor T2 is connected to the driving source electrode S1 of the driving thin film transistor T1 and is also connected to the driving voltage line 152 via the operation control thin film transistor T5. The switching thin film transistor T2 is turned on in response to the scanning signal Sn that is provided through the scanning line 121 and performs the switching operation to provide the data signal Dm, which is provided through the data line 151, to the driving source electrode S1 of the driving thin film transistor T1.

A compensation gate electrode G3 of the compensation thin film transistor T3 is connected to the scanning line 121. A compensation source electrode S3 of the compensation thin film transistor T3 is connected to the driving drain electrode D1 of the driving thin film transistor T1 and is also connected to the pixel electrode of the organic light-emitting diode OLED via the emission control thin film transistor T6. A compensation drain electrode D3 of the compensation driving thin film transistor T3 is connected to the first electrode Cst1 of the storage capacitor Cst, a first initialization drain electrode D4 of the first initialization thin film transistor T4, and the driving gate electrode G1 of the driving thin film transistor T1. The compensation thin film transistor T3 is turned an in response to the scanning signal Sn provided through the scanning line 121 and electrically connects the driving gate electrode G1 and the driving drain electrode D1 in the driving thin film transistor T1 to each other, thereby diode-connecting the driving thin film transistor T1.

A first initialization gate electrode G4 of the first initialization thin film transistor T4 is connected to the previous scanning line 122. The first initialization drain electrode D4 of the first initialization thin film transistor T4 is connected to a second initialization drain electrode D7 of the second initialization thin film transistor T7 and the initialization voltage line 131. A first initialization source electrode S4 of the first initialization thin film transistor T4 is connected to the compensation drain electrode D3 of the compensation thin film transistor T3 and the driving gate electrode G1 of the driving thin film transistor T1. The first initialization thin film transistor T4 is turned on in response to the previous scanning signal Sn−1 that is provided through the previous scanning line 122 and provides the initialization voltage Vint to the driving gate electrode G1 of the driving thin film transistor T1, thereby performing an initialization operation to initialize a voltage of the driving gate electrode G1 of the driving thin film transistor T1.

An operation control gate electrode G5 of the operation control thin film transistor T5 is connected to the emission control line 123. An operation control source electrode S5 of the operation control thin film transistor T5 is connected to the driving voltage line 152. An operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line 123. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are simultaneously turned on in response to the emission control signal En that is provided through the emission control line 123 such that the driving power voltage ELVDD is provided to the organic light-emitting diode OLED and the driving current $I_{OLED}$ flows through the organic light-emitting diode OLED.

A second initialization gate electrode G7 of the second initialization thin film transistor T7 is connected to the previous scanning line 122. The second initialization source electrode S7 of the second initialization thin film transistor T7 is connected to the pixel electrode of the organic light-emitting diode OLED. The second initialization drain electrode D7 of the second initialization thin film transistor T7 is connected to the first initialization source electrode S4 of the first initialization thin film transistor T4 and the initialization voltage line 131. The second initialization thin film transistor T7 is turned on in response to the previous scanning signal Sn−1 that is provided through the previous scanning line SL−1 and initializes the pixel electrode of the organic light-emitting diode OLED.

In FIG. 3, the first initialization thin film transistor T4 and the second initialization thin film transistor T7 are connected to the previous scanning line 122. However, exemplary embodiments are not limited thereto. In another exemplary embodiment the first initialization thin film transistor T4 may be connected to the previous scanning line 122 and driven in response to the previous scanning signal Sn−1, and the second initialization thin film transistor T7 may be connected to another signal line (for example, a next scanning line) and be driven in response to a signal that is provided to the signal line. However, positions of the source electrodes S1 through S7 and the drain electrodes D1 through D4 may be changed with one another according to a type of a transistor (p-type or n-type). Furthermore, in other exemplary embodiments, the number of transistors, functions and arrangement thereof may be modified from the exemplary embodiment shown in FIG. 3.

Specific operations of respective pixels PX according to an exemplary embodiment are as follows:

In an initialization period, when the previous scanning signal Sn−1 is supplied through the previous scanning line 122, the first initialization thin film transistor T4 is turned on in response to the previous scanning signal Sn−1, and the driving thin film transistor T1 is initialized by an initialization voltage Vint supplied from the initialization voltage line 131.

In a data programming period, when the scanning signal Sn is supplied through the scanning line 121, the switching thin film transistor T2 and the compensation transistor T3 are turned on in response to the scanning signal Sn. At this time, the driving thin film transistor T1 is diode-connected and biased in a positive direction by the compensation thin film transistor T3 that is turned on.

A compensation voltage Dm+Vth (Vth is a negative value), which is a value decreased from the data signal Dm provided from the data line 151 by a threshold voltage Vth of the driving thin film transistor T1, is applied to the driving gate electrode G1 of the driving thin film transistor T1.

The driving power voltage ELVDD and the compensation voltage Dm+Vth are respectively applied to two ends of the storage capacitor Cst, and a charge corresponding to a difference between tire driving power voltage ELVDD and the compensation voltage Dm+Vth is stored in the storage capacitor Cst.

Figure 4:
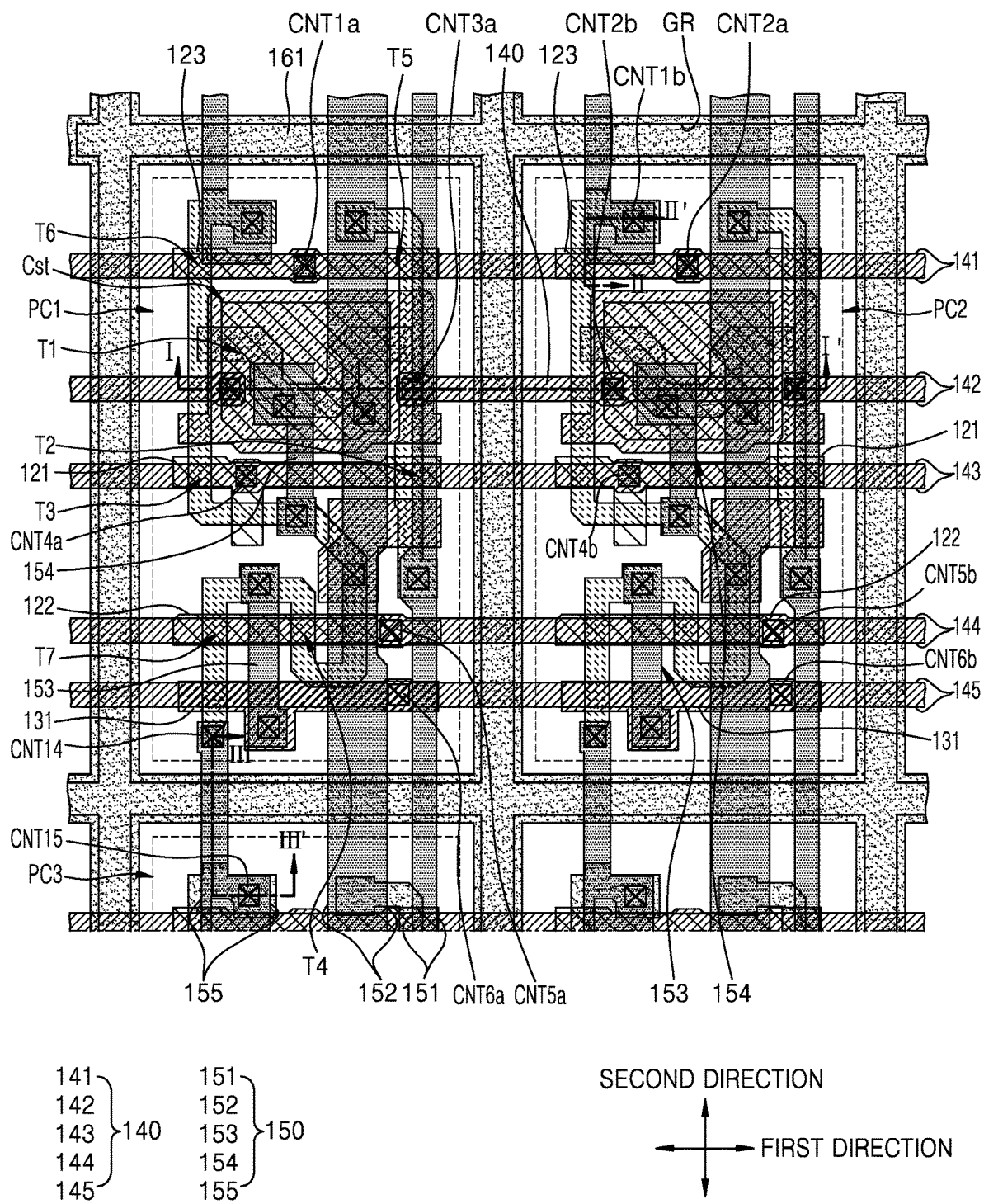
FIG. 4 is a plan view showing positions of a plurality of thin film transistors and storage capacitors in adjacent pixel circuits according to an exemplary embodiment of the present inventive concepts.
Figure 5A:
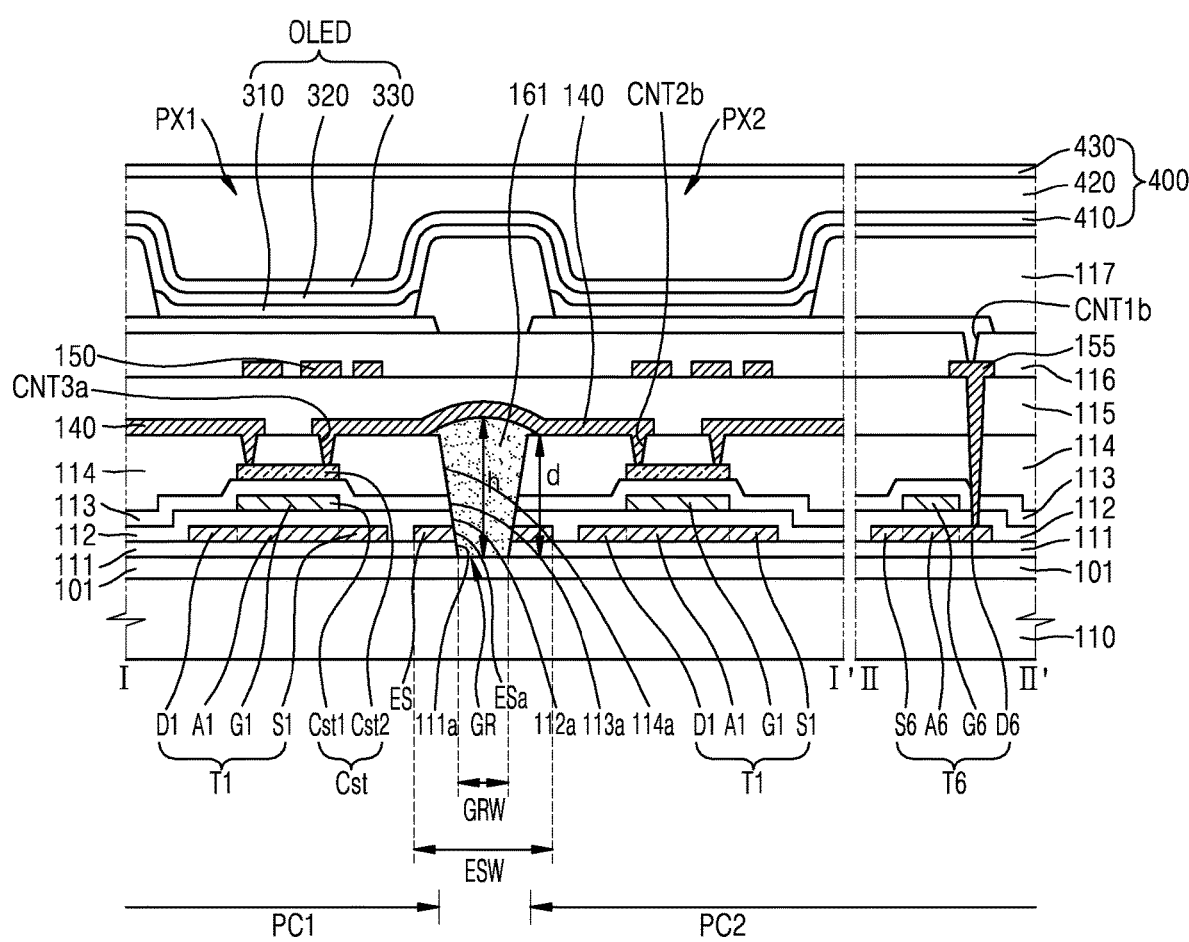
FIG. 5A is a cross-sectional view taken along lines I-I' and II-II' of FIG. 4 according to an exemplary embodiment of the present inventive concepts.

In an emission period, the operation control thin film transistor T5 and the emission control thin film transistor T6 are turned or in response to the emission control signal En supplied from the emission control line 123. A driving current $I_{OLED}$ according to a voltage difference between a voltage of a gate electrode of the driving thin film transistor T1 and the driving power voltage ELVDD is generated. The driving current $I_{OLED}$ is supplied to the organic light-emitting diode OLED through the emission control thin film transistor T6, FIG. 4 is a plan view showing positions of a plurality of thin film transistors and storage capacitors in adjacent pixel circuits. FIG. 5A is a cross-sectional view taken along lines I-I' and II-II' of FIG. 4.

Referring to FIGS. 4 and 5A, the display apparatus according to an exemplary embodiment of the present inventive concepts includes an inorganic material layer that has a groove GR in an area between the plurality of pixel circuits (e.g., first pixel circuit PC1, second pixel circuit PC2 and third pixel circuit PC3), and an organic filler 161 that is disposed in the groove and fills the groove. An etch stop layer ES is provided on a portion of a bottom surface or a side wall of the groove GR.

The display apparatus according to an exemplary embodiment may include a first connection wiring 140 that is arranged on the organic filler 161 and crosses the organic filler 161 in a first direction and/or a second connection wiring 150 that is arranged on the organic filler 161 and crosses the organic filler 161 in a second direction.

In an exemplary embodiment of the present inventive concepts, a barrier layer 101, a buffer layer 111, a first gate insulating layer 112, a second gate insulating layer 113, a third gate insulating layer 114, and the etch stop layer ES, are arranged under the first connection wiring 140 and include an inorganic material. The barrier layer 101, the buffer layer 111, the first gate insulating layer 112, the second gate insulating layer 113, the third gate insulating layer 114, and the etch stop layer ES may be collectively referred to as the inorganic material layer. The inorganic material layer includes the groove GR in an area between adjacent pixels. For example, as shown in FIGS. 4 and 5A, the groove GR may be in an area between a first pixel PX1 and a second pixel PX2 in the first direction. The groove GR may also be in an area between pixels of the first pixel circuit PX1 and third pixel circuit PX3 in the second direction.

In an exemplary embodiment of the present inventive concepts, the etch stop layer ES may indicate a layer having an etch rate that is different from those of other layers included in the inorganic material layers, for example, the barrier layer 101, the buffer layer 111, the first gate insulating layer 112, the second gate insulating layer 113, and the third gate insulating layer 114. The etch stop layer ES may also indicate a layer that is etched by an etch condition different from those of the above-mentioned layers.

In some exemplary embodiments, the etch stop layer ES may include a semiconductor material or a metal. In these embodiments, the barrier layer 101, the buffer layer 111, the first gate insulating layer 112, the second gate insulating layer 113, and the third gate insulating layer 114 may include an insulating material such as silicon oxide ($SiO_x$), silicon nitride ($SiN_x$), or silicon oxynitride (SiON).

FIG. 5A shows an exemplary embodiment in which the inorganic material layer includes the groove GR. For example, the barrier layer 101 may be continuously formed over a first pixel circuit PC1 and a second pixel circuit PC2 that are adjacent to each other. The buffer layer 111, the etch stop layer ES, the first gate insulating layer 112, the second gate insulating layer 113, and the third gate insulating layer 114 may have openings 111a, ESa, 112a, 113a, and 114a, respectively, in an area between the adjacent pixels to form the portion of the groove GR therein.

Accordingly, the inorganic material layer that includes the barrier layer 101, the buffer layer 111, the etching prevention layer ES, the first gate insulating layer 112, the second gate insulating layer 113, and the third gate insulating layer 114 may include the groove GR in the area between the adjacent pixels. The groove GR may indicate a trench that is formed in the inorganic material layer.

In other exemplary embodiments of the present inventive concepts, the inorganic material layer may include grooves having different shapes from the shape of the groove GR shown in FIG. 5A and the groove GR may be variously modified. For example, in one embodiment, the bottom of the buffer layer 111 may remain and the opening 111a may be formed in a region above the bottom of the buffer layer.

In an exemplary embodiment, the width GRW of the groove GR in the inorganic insulating layer may be several μms. For example, the width GRW of the groove GR in the inorganic insulating layer may be from about 5 μm to about 10 μm.

The groove GR may be formed by using an extra mask process and etching process after forming the third gate insulating layer 114. In the present exemplary embodiment, the etch stop layer ES may be provided for accuracy of the etching process. The etch stop layer ES and the formation of the groove GR by an etching process will be described later.

The groove GR in the inorganic material layer may be filled with the organic filler 161. The first connection wiring 140 and the second connection wiring 150 may be arranged on (e.g., directly on or above) the organic filler 161 in an area in which the organic filler 161 is located.

The groove GR and the organic filler 161 of the inorganic material layer may be at least partially between the plurality of pixel circuits. In FIG. 4, the groove GR and the organic filler 161 of the inorganic material layer are located to surround each of the first pixel circuit PC1 and the second pixel circuit PC2 (e.g., in the plane formed by the first and second directions). For example, the organic filler 161 is arranged to surround a circumference of the first pixel circuit PC1 and a circumference of the second pixel circuit PC2 to form a series of contiguous rectangular shapes surrounding the pixels. However, exemplary embodiments of the present inventive concepts are not limited thereto.

For example, the groove GR of the inorganic material layer and the organic filler 161 therein may be formed to extend from an area between the first pixel circuit PC1 and the second pixel circuit PC2 in the second direction, without surrounding each of the first pixel circuit PC1 and the second pixel circuit PC2. In addition, the groove GR of the inorganic material layer and the organic filler 161 may be variously modified. For example, the groove GR and the organic filler 161 of the inorganic material layer may be formed to extend in the first direction from the area between the plurality of pixel circuits.

The groove GR of the inorganic material layer and the organic filler 161 may minimize impacts on the display apparatus due to external shocks. Since the inorganic material layer has a solidity that is higher than the solidity of the organic filler 161, there is a high probability that cracks may occur due to external shocks. When cracks occur in the inorganic material layer, the cracks may also occur in various signal lines arranged in the middle or top of the inorganic material layer. Therefore, there is high probability that defects, such as disconnection, may occur due to cracks in the inorganic material layer.

However, in the display apparatus according to exemplary embodiments of the present inventive concepts, since the inorganic material layer has the groove GR including the organic filler 161 in the area between the plurality of pixels, there is a low probability of crack propagation when there is an external shock. In addition, since the solidity of the organic filler 161 is tower than the solidity of the inorganic material layer, the organic filler 161 may absorb stress due to an external shock and effectively minimize any stress directed to the first connection wiring 140 and the second connection wiring 150 located on the organic filler 161.

The first connection wiring 140 and the second connection wiring 150, which are arranged on the organic filler 161, may connect the plurality of pixel circuits to one another. For example, as shown in FIG. 5A, the first connection wiring 140 may connect the first pixel PX1 to the adjacent second pixel PX2. The first connection wiring 140 and the second connection wiring 150 may be arranged on the inorganic material layer in an area where the organic filler 161 is not located. The first connection wiring 140 and the second connection wiring 150 may function as lines for providing electric signals to the plurality of pixel circuits.

The first connection wiring 140 and the second connection wiring 150 may extend at a greater length (e.g., the first connection wiring 140 in the first direction and the second connection wiring 150 in the second direction) than the lengths of the other lines. Therefore, stress to the display apparatus due to shock is more likely to be applied to the first connection wiring 140 and the second connection wiring 150 as compared to other elements of the display apparatus.

In an exemplary embodiment, the first connection wiring 140 and the second connection wiring 150 include a material having a high elongation rate. For example, the first connection wiring 140 and the second connection wiring 150 may include aluminum. However, exemplary embodiments of the present inventive concepts are not limited thereto. Therefore, the first connection wiring 140 and the second connection wiring 150 which include a material having a high elongation rate may absorb shock while preventing the occurrence of errors such as a crack or disconnection. The first connection wiring 140 and the second connection wiring 150 may have multi-layer structures as needed. In some exemplary embodiments, a stack structure including Ti/Al/Ti may be applied to the first connection wiring 140 and the second connection wiring 150. In some exemplary embodiments, elongation rates of the first connection wiring 140 and the second connection wiring 150 may be higher than the elongation rates of the material of the layers that are arranged thereunder.

Hereinafter, referring to FIGS. 4 and 5A, a display apparatus according to an exemplary embodiment will be described in detail.

The substrate 110 may include a glass material, a ceramic material, a metal material, or a material that is flexible or bendable. For example, in embodiments in which the substrate 110 is flexible or bendable, the substrate 110 may include a high molecular weight resin such as polyethersulphone, polyacrylate, polyetherimide, polyethylene naphthalate, polyethylene terephthalate, polyphenylene sulfide, polyarylate, polyimide, polycarbonate, cellulose acetate propionate or combinations thereof. However, exemplary embodiments of the present inventive concepts are not limited thereto. The substrate 110 may have a single layer or a multi-layer structure including the above-mentioned materials. In an embodiment having the multi-layer structure, the substrate 110 may further include an inorganic layer. In some exemplary embodiments, the substrate 110 may have a structure including combinations of an organic material and an inorganic material.

The display apparatus may further include the barrier layer 101 between the substrate 110 and the buffer layer 111. For example, as shown in the exemplary embodiment of FIG. 5A, the barrier layer 101 may be disposed directly on the substrate 110. The barrier layer 101 may prevent or minimize impurities, such as impurities from the substrate 110, from permeating into the semiconductor layer. In an exemplary embodiment, the barrier layer 101 may include an inorganic material such as an oxide or a nitride, an organic material, or an organic-inorganic complex material. The barrier layer 101 may include a single layer or a multi-layer structure including an inorganic material and an organic material.

The buffer layer 111 may be disposed on the barrier layer 101. For example, as shown in the exemplary embodiment of FIG. 5A, the buffer layer 111 may be disposed directly on the barrier layer 101. The buffer layer 111 may improve the smoothness of the upper surface of the substrate 110. In an exemplary embodiment, the buffer layer 111 may include an inorganic material such as silicon oxide, silicon nitride, and/or silicon oxynitride. However, exemplary embodiments of the present inventive concepts are not limited thereto.

Semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged on the buffer layer 111. For example, as shown in the exemplary embodiment of FIG. 5A, the semiconductor layers may be arranged directly on the buffer layer 111. In an exemplary embodiment, the semiconductor layers may include the same material. For example, the semiconductor layers may include polycrystalline silicon, amorphous silicon, or an oxide semiconductor. However, exemplary embodiments of the present inventive concepts are not limited thereto. The semiconductor layers may be connected to one another and bent in various shapes.

The semiconductor layer may include channel areas, source areas and drain areas. For example, as shown in FIG. 5A, the semiconductor layer of the driving thin film transistor T1 and the emission control thin film transistor T6 may include respective channel areas A1, A6, respective source areas S1, S6 and respective drain areas D1, D6. The source areas S1 and S6 and drain areas D1 and D6 are arranged on lateral sides adjacent the channel areas A1 and A6, respectively. The source area and the drain area may be doped with an impurity, and the impurity may include a n-type impurity or a p-type impurity. The source area and the drain area respectively correspond to a source electrode and a drain electrode. Hereinafter, terms "source area" and "drain area" will be used instead of the source electrode or the drain electrode.

The first gate insulating layer 112 is located on the semiconductor layer. For example, as shown in the exemplary embodiment of FIG. 5A the first gate insulating layer 112 may be disposed directly on the semiconductor layer. The first gate insulating layer 112 may include an organic material that includes an oxide material or a nitride material. For example, the first gate insulating layer 112 may include silicon dioxide $SiO_2$, silicon nitride ($SiN_x$), silicon oxynitride (SiON), aluminum oxide ($Al_2O_3$), titanium dioxide ($TiO_2$), tantalum oxide ($Ta_2O_5$), hafnium oxide ($HfO_2$), zinc oxide ($ZnO_2$), and the like. However, exemplary embodiments of the present inventive concepts are not limited thereto.

In the present embodiment, the semiconductor layers of the plurality of pixel circuits are formed separately front one another. For example, the semiconductor layer of the first pixel circuit PC1 is spaced apart (e.g., in the first direction) from the semiconductor layer of the second pixel circuit PC2. However, in other exemplary embodiments of the present inventive concepts, at least one semiconductor layer may be formed integrally between a plurality of pixel circuits.

The scanning line 121, the previous scanning line 122, the emission control line 123, and the driving gate electrode G1 are arranged on the first gate insulating layer 112. The scanning line 121, the previous scanning line 122, the emission-control line 123, and the driving gate electrode G1 are arranged on a same layer and include a same material. For example, the scanning line 121, the previous scanning line, the emission control line 123, and the driving gate electrode G1 may include molybdenum (Mo), copper (Cu), titanium (Ti) and the like, and may each include a single layer or multiple layers. However, exemplary embodiments of the present inventive concepts are not limited thereto.

The driving gate electrode G1 is an island type electrode and is arranged to overlap (e.g., in the direction of the thickness of the substrate 110) the driving channel area A1 in a driving semiconductor layer. The driving gate electrode G1 may function not only as the gate electrode of the driving thin film transistor T1 but also as a first electrode Cst1 of the storage capacitor. For example, the driving gate electrode G1 and the first electrode Cst1 may be integrally formed.

Portions or protrusions of the scanning line 121, the previous scanning line 122, and the emission control line 123 correspond to the gate electrodes of the thin film transistors T2 through T7.

For example, portions of the scanning line 121 that overlap the switching channel area and the compensation channel area respectively correspond to the switching gate electrode and the compensation gate electrode. In the previous scanning line 122, areas overlapping the first initialization channel area and the second initialization channel area respectively correspond to the first initialization gate electrode and the second initialization gate electrode. In the emission control line 123, areas overlapping the operation control channel area and the emission control channel area respectively correspond to the operation control gate electrode G5 and the emission control gate electrode G6.

In the present exemplary embodiment, the scanning line 121, the previous scanning line 122, the emission control line 123, and the driving gate electrode G1 of each of the plurality of pixel circuits are separately formed from one another. For example, the scanning line 121, the previous scanning line 122, the emission control line 121, and the driving drain electrode G1 of the first pixel circuit PC1 may be formed as discrete, spaced apart (e.g., in the first direction) lines from the scanning line 121, the previous scanning line 122, the emission control line 123, and the driving gate electrode of the second pixel circuit PC2, respectively.

In this embodiment, the scanning line 121, the previous scanning line 122, and the emission control line 123 of the first pixel circuit PC1 may be respectively connected to the scanning line, the previous scanning line, and the emission control line of the second pixel circuit PC2 by the first connection wiring 140 which is arranged on another layer.

The second gate insulating layer 113 is arranged on the scanning line 121, the previous scanning line 122, the emission control line 123, and the driving gate electrode G1. For example, the second gate insulating layer 113 may be disposed directly on the scanning line 121, the previous scanning line 122, the emission control line 123, and the driving gate electrode G1. The second gate insulating layer 113 may include an inorganic material that includes an oxide material or a nitride material. For example, the second gate insulating layer 113 may include $SiO_2$, $SiN_x$, SiON, $Al_2O_3$, $TiO_2$, $Ta_2O_5$, $HfO_2$, $ZnO_2$, or the like. However, exemplary embodiments of the present inventive concepts are not limited thereto.

A second electrode Cst2 of the transistor Cst and the initialization voltage line 131 are located on the second gate insulating layer 113. The second electrode Cst2 of the storage capacitor Cst and the initialization line 131 are arranged on a same layer and include a same material. For example, the second electrode Cst2 of the storage capacitor Cst and the initialization voltage line 131 may include a material that includes Mo, Cu, Ti, and the like, and may be formed into a multi-layer or a single-layer including the above-mentioned materials. However, exemplary embodiments of the present inventive concepts are not limited thereto.

In the present exemplary embodiment, the second electrode Cst2 of the storage capacitor Cst and the initialization voltage 131 of each of the plurality of pixel circuits are discrete and spaced apart from each other. For example, the second electrode Cst2 of the storage capacitor Cst of the first pixel circuit PC1 and the second electrode Cst2 of the storage capacitor Cst of the second pixel PC2 are spaced apart (e.g., in the first direction) and separate from each other. The initialization voltage line 131 of the first pixel circuit PC1 and the initialization voltage line 131 of the second pixel circuit PC2 are spaced apart (e.g., in the first direction) and separate from each other.

The third gate insulating layer 114 is arranged on the second electrode Cst2 of the storage capacitor Cst and the initialization voltage line 131. For example, the third gate insulating layer 114 may be disposed directly on the second electrode Cst2 of the storage capacitor Cst and the initialization voltage line 131. The third gate insulating layer 114 may include an inorganic material that includes an oxide material or a nitride material. For example, the third gate insulating layer 114 may include $SiO_2$, $SiN_x$, SiON, $Al_2O_3$, $TiO_2$, $Ta_2O_5$, $HfO_2$, $ZnO_2$, or the like. However, exemplary embodiments of the present inventive concepts are not limited thereto.

The first connection wiring 140 that extends in the first direction is arranged on the third gate insulating layer 114. For example, as shown in FIG. 5A, the first connection wiring 140 may be disposed directly on the third gate insulating layer 114. The first connection wiring 140 extends from the first pixel circuit PC1 to the second pixel circuit PC2 and connects these pixel circuits to each other. The first connection wiring 140 may connect the plurality of pixel circuits arranged in a first direction.

In the present exemplary embodiment, conductive layers of the semiconductor layer, the scanning line 121, the previous scanning line 122, the emission control line 123, the initialization voltage line 131, the first electrode Cst1 and the second electrode Cst2 of the storage capacitor Cst, and the like are discrete and separately formed in each pixel circuit. Therefore, stress that may be generated in one pixel circuit may be prevented from propagating to another pixel circuit. Additionally, since the first connection wiring 140 may include a material having a high elongation rate, errors due to stress may be minimized.

The first connection wiring 140 may include an emission control connection line 141, a mesh connection line 142, a scanning connection line 143, a previous scanning connection line 144, and an initialization voltage connection line 145. While line I-I' of FIG. 5A shows the mesh connection line 142 for the first connection line 140, a similar structure may be utilized for the emission control connection line 141, the scanning connection line 143, the previous scanning connection line 144, and the initialization voltage connection line 145.

The emission control connection line 41 connects the emission control fine 123 of the first pixel circuit PC1 and the emission control line 123 of the second pixel circuit PC2 through contact holes CNT1a and CNT2a that are formed to penetrate the third gate insulating layer 114 and the second gate insulating layer 113. The emission control connection line 141 may overlap (e.g., in the direction of the thickness of the substrate 110) the emission control line 123 of the first pixel circuit PC1 and the emission control line 123 of the second pixel circuit line PC2 and extend in the first direction.

The mesh connection line 142 connects the second electrode Cst2 of the first pixel circuit PC1 and the second electrode Cst2 of the second pixel circuit PC2 via contact holes CNT3a and CNT2b formed through the third gate insulating layer 114. As the second electrode Cst2 of the storage capacitor Cst is connected to the driving voltage line 152 and receives the driving voltage, the mesh connection line 142 may deliver the driving voltage to the plurality of pixels arranged in the first direction. Therefore, a driving voltage line having a mesh structure may be formed by the mesh connection line 142 without requiring an additional area for accommodating a separate driving voltage line extending in the first direction. Therefore, this configuration provides additional area for the storage capacitor first to provide a high-definition display apparatus.

The scanning connection line 143 connects the scanning line 121 of the first pixel circuit PC1 and the scanning line 121 of the second pixel circuit PC2 through contact holes CNT4a and CNT4b formed through the third gate insulating layer 114 and the second gate insulating layer 113. The scanning connection line 143 may overlap (e.g., in the direction of the thickness of the substrate 110) the scanning line 121 of the pixel circuit PC1 and the scanning line 121 of the second pixel circuit PC2 and extend in the first direction.

The previous scanning connection line 144 connects the previous scanning line 122 of the first pixel circuit PC1 and the previous scanning line 122 of the second pixel circuit via contact holes CNT5a and CNT5b formed though the third gate insulating layer 114 and the second gate insulating layer 113. The previous scanning connection line 144 may overlap (e.g., in the direction of the thickness of the substrate 110) the previous scanning line 122 of the first pixel circuit PC1 and the previous scanning line 122 of the second pixel circuit PC2.

The initialization voltage connection line 145 connects the initialization voltage line 131 of the first pixel circuit PC1 and the initialization voltage line 131 of the second pixel circuit PC2 through contact holes CNT6a and CNT6b formed through the third gate insulating layer 114. The initialization voltage connection line 145 may overlap (e.g., in the direction of the thickness of the substrate 110) the initialization voltage line 131 of the first pixel circuit PC1 and the initialization voltage line 131 of the second pixel circuit PC2 and extend in the first direction.

As described above, the first connection wiring 140 may supply electric signals to the plurality of pixel circuits by connecting adjacent pixel circuits (e.g., the first pixel circuit PC1 and the second pixel circuit PC2) in a region on or above the organic filler 161 arranged between adjacent pixel circuits.

An interlayer insulating layer 115 is arranged on the first connection wiring 140. For example, the interlayer insulating layer 115 may be disposed directly on the first connection wiring 140. The interlayer insulating layer 115 may include an inorganic material that includes an oxide material or a nitride material. For example, the interlayer insulating layer 115 may include $SiO_2$, $SiN_x$, SiON, $Al_2O_3$, $TiO_2$, $Ta_2O_5$, $HfO_2$, $ZnO_2$, or the like. However, exemplary embodiments of the present inventive concepts are not limited to. In some exemplary embodiments, the interlayer insulating layer 115 may include an organic material such as benzocyclobutene (BCB), polyimide, or hexamethyldisiloxane. In exemplary embodiments in which the interlayer insulating layer 115 includes an organic material, stress that may be applied to wirings arranged above and below the interlayer insulating layer 115 may be reduced.

The second connection wiring 150 extending in the second direction is located on the interlayer insulating layer 115. The second connection wiring 150 is insulated from the first connection wiring 140 by the interlayer insulating layer 115. For example, as shown in FIG. 5A, the second connection wiring 150 may be disposed directly on the interlayer insulating layer 115. The second connection wiring 150 may include the data line 151, the driving voltage line 152, a first node connection line 153, a second rode connection line 154, and an intermediate connection line 155.

The data line 151, the driving voltage line 152, the first node connection line 153, the second node connection line 154, and the intermediate connection line 155 are arranged on a same layer and include a same material. For example, the data line 151, the driving voltage line 152, the first node connection line 153, the second node connection line 154, and the intermediate connection line 155 may include a conductive material having a high elongation rate.

While line II-II' of FIG. 5A shows the intermediate connection line 155 for the second connection line 150, a similar structure may be utilized for the data line 151, the driving voltage line 152, the first node connection line 153 and the second node connection line 154.

The data line 151 is connected to the switching thin film transistor T2 via a contact hole that penetrates the interlayer insulating layer 115, the third gate insulating layer 114, the second gate insulating layer 113, and the first gate insulating layer 112. The data line 151 may connect the plurality of pixel circuits arranged in the second direction.

The driving voltage line 152 is connected to the operation control thin film transistor T5 via a contact hole that penetrates the interlayer insulating layer 115, the third gate insulating layer 114, the second gate insulating layer 113, and the first gate insulating layer 112. In addition, the driving voltage line 152 is connected to the second electrode Cst2 of the storage capacitor via a contact hole that penetrates the interlayer insulating layer 115 and the third gate insulating layer 114. The driving voltage line 152 may connect the plurality of pixel circuits arranged in the second direction.

The first node connection line 153 is connected to the first initialization thin film transistor T4 and the second initialization thin film transistor T7 via a contact hole that penetrates the interlayer insulating layer 115, the third gate insulating layer 114, the second gate insulating layer 113, and the first gate insulating layer 112. The first node connection line 153 is also connected to the initialization voltage line 131 via a contact hole that penetrates the interlayer insulating layer 115 and the third gate insulating layer 114.

The second node connection line 154 connects the driving gate electrode G1 and the compensation drain area of the compensation thin film transistor T3 via a contact hole. The driving gate electrode G1 is an island type that may be electrically connected to the compensation thin film transistor T3.

The intermediate connection line 155 may be connected to the second initialization thin film transistor T7 via a contact hole that penetrates the interlayer insulating layer 115, the third gate insulating layer 114, the second gate insulating layer 113, and the first gate insulating layer 112. As shown in FIG. 5A, the intermediate connection line 155 may be connected to the emission control thin film transistor T6 via a contact hole that penetrates the interlayer insulating layer 115, the third gate insulating layer 114, the second gate insulating layer 113, and the first gate insulating layer 112.

The data line 151, the driving voltage line 152, and the intermediate connection line 155 may connect pixel circuits that are adjacent to one another in the second direction (e.g., the first pixel circuit PC1 and the third pixel circuit PC3) and across the groove GRV and the organic filler 161 therebetween.

A planarization layer 116 is arranged on the data line 151, the driving voltage line 152, the first node connection line 153, the second node connection line 154, and the intermediate connection line 155. For example, the planarization layer 116 may be disposed directly on the data line 151, the driving voltage line 152, the first node connection line 153, the second node connection line 154, and the intermediate connection line 155. The planarization layer 116 may include an organic material such as acryl, BCB, PI, or HDMSO. However, exemplary embodiments of the present inventive concepts are not limited thereto. Alternatively, the planarization layer 116 may include an inorganic material.

The planarization layer 116 may have a function of generally planarizing an upper portion of a protection film that covers the thin film transistors T1 through T7. The planarization layer 116 may be provided as a single-layer or a multi-layer.

Referring to FIG. 5A, the organic filler 161 is arranged to at least partially fill the groove GR of the inorganic material layer between the first pixel circuit PC1 and the second pixel circuit PC2. The organic filler 161 may not completely fill the groove GR. In addition, the organic filler 161 may not be included in some grooves GR.

However, in an exemplary embodiment, the groove GR is completely filled by the organic filler 161 to increase absorption of an external shock. In some exemplary embodiments, the organic filler 161 may be formed to extend to an upper surface of the inorganic material layer. In this embodiment, in consideration of a property of the organic filler 161, the upper surface of the organic filler 161 may be provided in a convex shape. For example, a greatest height h of the organic filler 161 may extend from the upper surface of the barrier layer 101 to above the third gate insulating layer 114. The greatest height h of the organic filler 161 may be formed to be greater than the depth d of the groove GR which extends from an upper surface of the barrier layer 101 to the upper surface of the third gate insulating layer 114.

An angle of a line extending from an upper surface of the organic filler to the upper surface of the inorganic insulating layer may be within 45 degrees. For example, the angle of a line extending from the upper surface of the organic filler 161 to the upper surface of the inorganic insulating layer may be in a range of 10° to 45°. When the slope of a boundary area between the inorganic material layer and the upper surface of the organic filler 161 is not even, the conductive material of the first connection wiring 140 may remain in the boundary area without being removed when a process of forming the first connection wiring by patterning the conductive layer is performed. Therefore, the conductive material that remains due to the uneven slope of the boundary area between the inorganic material layer and the upper surface of the organic filler 161 may cause shorts between other conductive layers. Accordingly, it is preferable that the upper surface of the organic filler 161 is formed to have an even slope with respect to the upper surface of the inorganic material layer.

In an exemplary embodiment, the organic filler 161 may include one or more materials from among acryl, metacrylic, polyester, polyethylene, polypropylene, polyethylene terephthalate, polyethylene naphthalate, polycarbonate, polyamide, polyethylene sulfonate, polyoxymethylene, polyarylate, and hexamethyldisiloxane. However, exemplary embodiments of the present inventive concepts are not limited thereto.

The organic filler 161 may be arranged in the groove GR of the inorganic material layer in the area between the first pixel circuit PC1 and the second pixel circuit PC2, and may separate the first pixel circuit PC1 and the second pixel circuit PC2 from each other in the portions under the first connection wiring 140. The groove GR and the organic filler 161 therein prevent the propagation of stress and/or the formation of a crack from the first pixel circuit PC1 to the second pixel circuit PC2.

The organic light-emitting diode OLED including a pixel electrode 310, an opposite electrode 330, and intermediate layer 320 located therebetween. The intermediate layer includes an emission layer (EML). The organic light-emitting diode OLED may be arranged on the planarization layer 116.

The pixel electrode 310 is connected to the intermediate connection line 155 via a contact hole CNT1b defined in the planarization layer 116 and is connected to the emission control drain area D6 of the emission control thin film transistor T6 by the intermediate connection line 155.

A pixel defining layer 117 may be arranged on the planarization layer 116. The pixel defining layer 117 defines pixels by having an opening corresponding to each sub pixel. For example, the opening exposes at least a center area of the pixel electrode 310. The pixel defining layer 117 also prevents occurrence of arcs and the like at the edges of the pixel electrode 310, by increasing distances between the edges of the pixel electrode 310 and the opposite electrode 330 above the pixel electrode 310. The pixel defining layer 120 may include an organic material, for example, PI, HMDSO, and the like. However, exemplary embodiments of the present inventive concepts are not limited thereto.

The intermediate layer 320 of the organic light-emitting diode OLED may include a low molecular weight material or a high molecular weight material. When the intermediate layer 320 includes a low molecular weight material, a hole injection layer (HIL), an emission layer (EML), an electron transport layer (ETL), an electron injection layer (EIL), and the like may each have a single-layer structure or a multi-layered stack structure, and the low molecular weight material may include various organic materials such as copper phthalocyanine (CuPc), N,N'-Di(Naphthalene-1-yl)-N,N'-diphenyl-benzidine (NPB), tris-8-hydroxyquinoline aluminum (Alq3). Such layers may be formed by a vacuum deposition method. However, exemplary embodiments of the present inventive concepts are not limited thereto.

Exemplary embodiments in which the intermediate layer 320 includes a high molecular weight material may usually have a structure that includes a hole transport layer (HTL) and an emission layer (EML). In this embodiment, the HTL may include Poly(3,4-ethylenedioxythiophene (PEDOT)), and the EML may include a high molecular weight material such as a poly-phenylenevinylene material and polyfluorene. The intermediate layer 320 may be formed by using a screen printing method, an inkjet printing method, a laser induced thermal imaging (LITI) method, and the like.

However, the intermediate layer 320 is not limited thereto and may have various structures. In addition, the intermediate layer 320 may include a layer integrally formed over the plurality of pixel electrodes 310, and may also include a layer that is patterned to correspond to each of the pixel electrodes 310.

The opposite electrode 330 is arranged in an upper portion (e.g., in the direction of the thickness of the substrate 110) of the display area DA. The opposite electrode may be arranged to cover the display area DA, as shown in FIG. 5A. For example, the opposite electrode 330 may be integrally formed with respect to organic light-emitting diodes OLED of a plurality of pixel circuits.

Since the organic light-emitting diode OLED may be easily damaged due to moisture or oxygen from the outside, an encapsulation layer 400 may cover the organic light-emitting diodes OLED for protection. The encapsulation layer 400 may cover the display area and extend to an outer area of the display area DA. In an exemplary embodiment, the encapsulation layer 400 may include a first inorganic encapsulation layer 410, an organic encapsulation layer 420, and a second inorganic encapsulation layer 430. However, exemplary embodiments of the present inventive concepts are not limited thereto.

The first inorganic encapsulation layer 410 may cover the opposite electrode 330 and include ceramic, a metal oxide, a metal nitride, a metal carbide, a metal oxynitride, indium oxide ($In_2O_3$), tin oxide ($SnO_2$), indium tin oxide (ITO), silicon oxide, silicon nitride and/or silicon oxynitride, and the like. However, exemplary embodiments of the present inventive concepts are not limited thereto. In certain embodiments, additional layers (e.g., a capping layer, etc.) may be disposed as needed between the first inorganic encapsulation layer 410 and the opposite electrode 330. Since the first inorganic encapsulation layer 410 is formed over structures having an uneven thickness, an upper surface of the first inorganic encapsulation layer 410 is not evenly formed.

The organic encapsulation layer 420 covers the first inorganic encapsulation layer 410. The upper surface of the organic encapsulation layer 420 may be approximately even (e.g., approximately smooth). The upper surface of the organic encapsulation layer 420 may be approximately smooth in a portion corresponding to the display area DA. The organic encapsulation layer 420 may include one or more materials from among acryl, metacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane. However, exemplary embodiments of the present inventive concepts are not limited thereto.

The second inorganic encapsulation layer 430 may cover the organic encapsulation layer 420. The second inorganic encapsulation layer 430 may include ceramic, a metal oxide, a metal nitride, a metal carbide, a metal oxynitride, $In_2O_3$, $SnO_2$, ITO, silicon oxide, silicon nitride and/or silicon oxynitride, and the like. However, exemplary embodiments of the present inventive concepts are not limited thereto.

As described above, the encapsulation layer 400 includes the first inorganic encapsulation layer 410, the organic encapsulation layer 420, and the second inorganic encapsulation layer 430. This multi-layer structure may prevent cracks that occur in the encapsulation layer 400 from connecting between the first inorganic encapsulation layer 410 and the organic encapsulation layer 420 or between the organic encapsulation layer 420 and the second inorganic encapsulation layer 430. Therefore, the forming of a path through which external moisture or oxygen may permeate into the display area DA may be prevented or minimized.

A spacer for preventing chipping of a mask may be further provided on the pixel defining layer 117. Additionally, various functional layers such as a polarization layer, a black matrix, a color filter, and/or a touch screen layer including a touch electrode, which reduce reflection of external light, may be provided on the encapsulation layer 400.

In the present embodiments, the groove GR is provided in the inorganic layer that is arranged between pixel circuits adjacent to one another. In this embodiment, an etch stop layer ES is provided in a portion of a bottom surface or a side wall of the groove Gr.

The etch stop layer ES may indicate a layer having an etch rate that is different from those of other layers included in the inorganic material layers, for example, the barrier layer 101, the buffer layer 111, the first gate insulating layer 112, the second gate insulating layer 113, and the third gate insulating layer 114. The etch stop layer ES may also indicate an etch condition that is different from those of the other layers included in the inorganic material layers.

In some exemplary embodiments, the etch stop layer ES may include a semiconductor material or a metal. In this embodiment, the barrier layer 101, the buffer layer 111, the first gate insulating layer 112, the second gate insulating layer 113, and the third gate insulating layer 114 may include an insulating material such as $SiO_x$, $SiN_x$, or SiON.

Referring to FIG. 5A, the etch stop layer ES and the semiconductor layer of the driving thin film transistor T1 may be provided on a same layer and include a same material. For example, the etch stop layer ES may be arranged on the buffer layer 111 to form a portion of a side wall of the groove GR. Alternatively, the etch stop layer ES may be arranged in other layers to surround the groove GR and/or the organic filler 161. A width ESW of the etch stop layer ES from a first lateral edge to the opposing second lateral edge may be greater than a width GRW of the groove GR.

The etch stop layer ES may include an opening ESa corresponding to the groove GR. The opening ESa may form a portion of the groove GR.

In the present exemplary embodiment, the etch stop layer ES may utilized to prevent damage to the barrier layer 101 by adjusting a depth of the groove GR. For example, the etch stop layer ES may be provided for accuracy of an etching process that is performed for forming the groove GR.

Figure 5B:
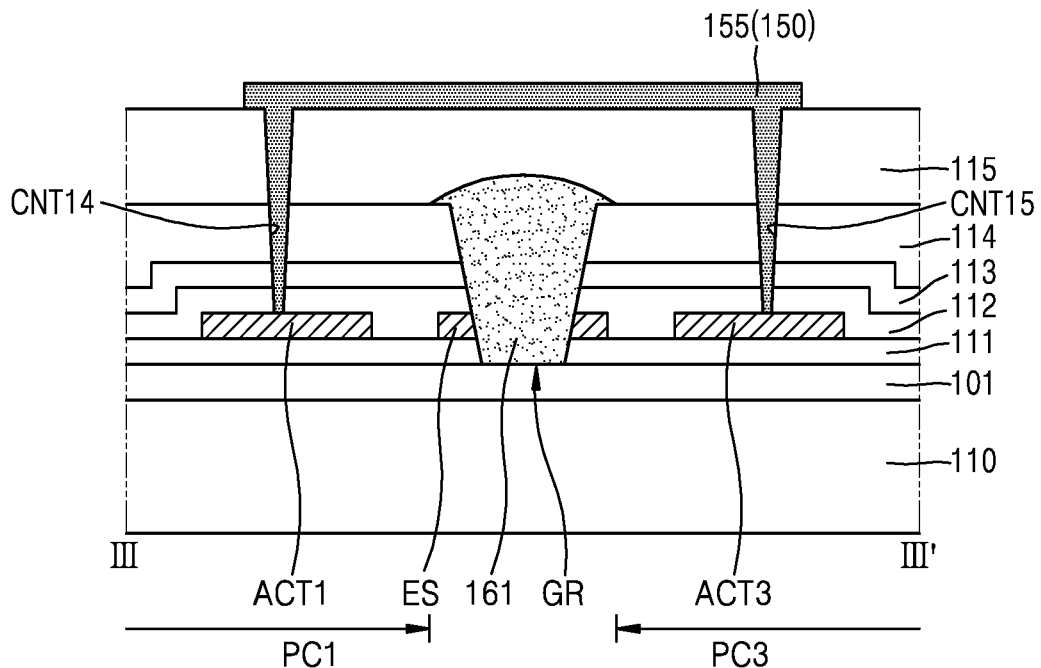
FIG. 5B is a cross-sectional view taken along line III-III' of FIG. 4 according to an exemplary embodiment of the present inventive concepts.

FIG. 5B is a cross-sectional view takes along line III-III' of FIG. 4 according to another exemplary embodiment.

Referring to FIG. 5B, a first end of an intermediate connection line 155 may be connected to a first semiconductor layer ACT1 of the first pixel circuit PC1 through a contact hole CNT14 that penetrates the interlayer insulating layer 115, the third gate insulating layer 114, the second gate insulating layer 113, and the first gate insulating layer 112. An area of the first semiconductor layer ACT1, to which the intermediate connection line 155 is connected, may function as a second initialization source area of the second initialization thin film transistor T7 of the first pixel circuit PC1.

The opposing second end of the intermediate connection line 155 may be connected to a third semiconductor layer ACT3 of the third pixel circuit PC3 via a contact hole CNT15 that penetrates the interlayer insulating layer 115, the third gate insulating layer 114, the second gate insulating layer 113, and the first gate insulating layer 112. An area of the third semiconductor area ACT, to which the intermediate connection line 155 is connected, may function as an emission control drain area of the emission control thin film transistor T6 of the third pixel circuit PC3.

The intermediate connection line 155, which is one of the second connection wirings 150, passes over the organic filler 161 in the groove GR arranged between the first pixel circuit PC1 and the third pixel circuit PC3 and connects the first pixel circuit PC1 and the third pixel circuit PC3 that are spaced apart in the second direction. The organic filler 161 may be arranged in the groove GR of the inorganic material layer in an area between the first pixel PX1 and the third pixel PX3 and may separate the first pixel circuit PC1 and the third pixel circuit PC3 in regions under the intermediate connection line 155 which prevents the propagation of stress or a crack.

The etch stop layer ES is provided in a portion of the bottom surface and/or the side wall of the groove GR and may prevent the barrier layer 101 from being damaged.

Figure 5C:
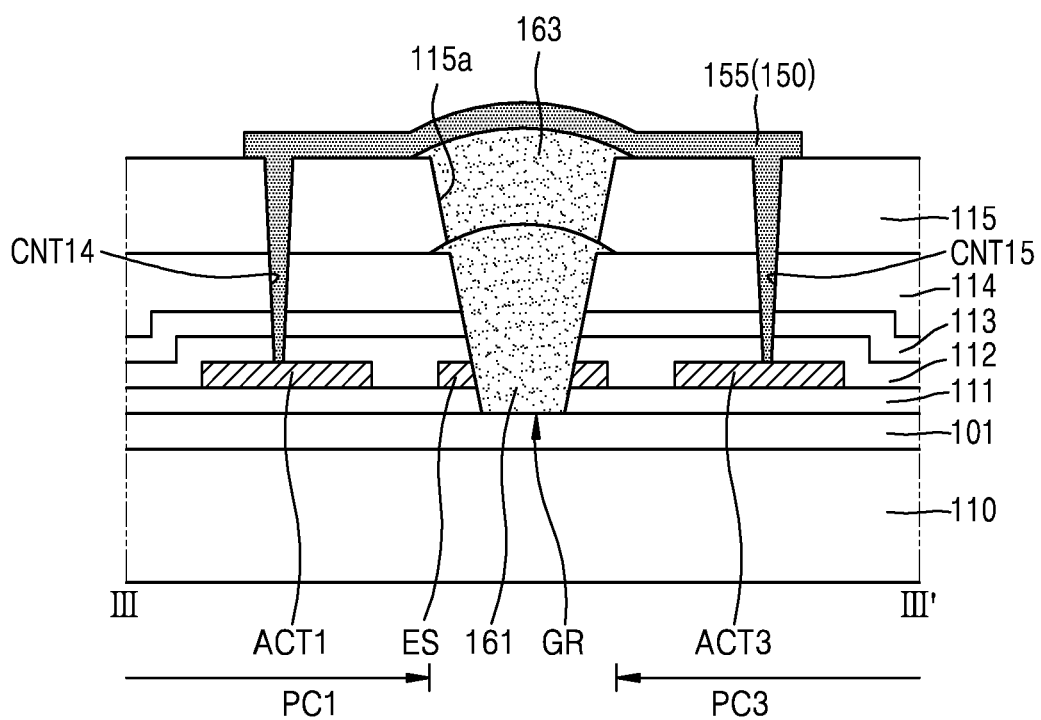
FIG. 5C is a cross-sectional view taken along line III-III' of FIG. 4 according to another exemplary embodiment of the present inventive concepts.

FIG. 5C is a cross-sectional view of the display apparatus taken along line III-III' of FIG. 4 in accordance with another exemplary embodiment.

Referring to FIG. 5C, a display apparatus according to an exemplary embodiment may further include an interlayer insulating layer 115 that has an opening 115a in the area between the plurality of pixel circuits. The opening 115a includes an upper organic filler 163 disposed therein to fill the opening 115a. The upper organic filler 163 may overlap with the organic filler 161 in the direction of the thickness of the substrate. The upper organic filler 163 may be disposed directly on the organic filler 161. Accordingly, the second connection wiring comprising the intermediate connection line 155 passes over the organic filler 161 and the upper organic filler 163 arranged between the first pixel circuit PC1 and the third pixel circuit PC3, and may connect the first pixel circuit PC1 and the third pixel circuit PC3 that are spaced apart in the second direction.

When the interlayer insulating layer 115 includes an opening 115a formed in the area between the plurality of pixels, a stress applied to the interlayer insulating layer 115 may be prevented from spreading. In addition, as the upper organic filler 163 is filled in the opening 115a, the upper organic filler 163 may absorb a stress applied to the display apparatus.

The upper organic filler 163 may include a same material as the material of the organic filler 161. The upper organic filler 163 may include one or more materials from among acryl, metacrylic, polyester, polyethylene, polypropylene, polyethylene terephthalate, polyethylene naphthalate, polycarbonate, polyimide, polyethylene sulfonate, polyoxymethylene, polyarylate, and hexamethyldisiloxane. However, exemplary embodiments of the present inventive concepts are not limited thereto.

Hereinafter, a function of the etch stop layer ES will be described with reference to FIGS. 6A through 6F. FIGS. 6A through 6F are cross-sectional views sequentially showing a process which includes the formation of the groove GR and the formation of the first connection wiring 140.

Figure 6A:
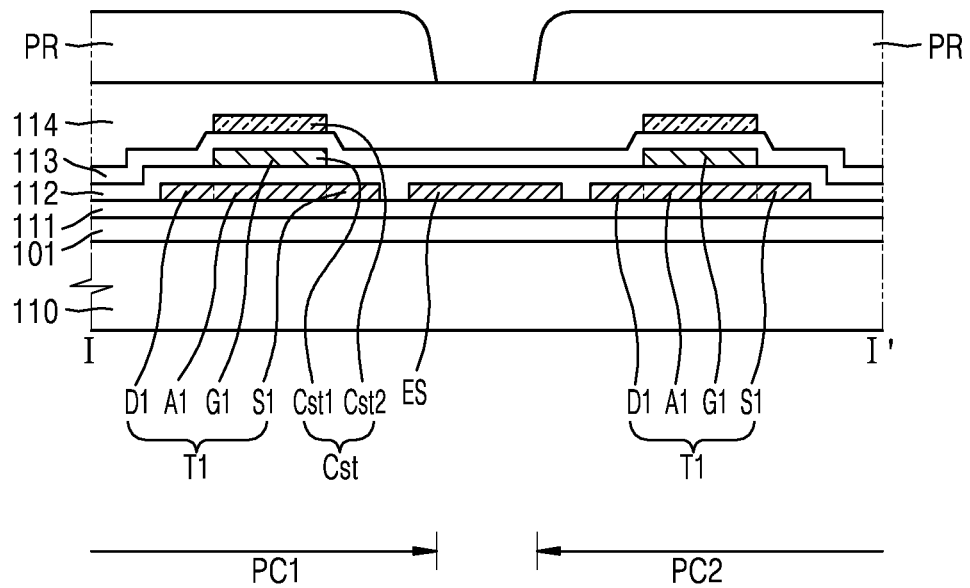
FIGS. 6A through 6F are cross-sectional views sequentially showing a process of forming the display apparatus according to an exemplary embodiment of the present inventive concepts.

Referring to FIG. 6A, the etch stop layer ES is first formed in each of the first pixel circuit PC1, the second pixel circuit P2, and the area between the first pixel circuit PC1 and the second pixel circuit PC2. In some exemplary embodiments, the etch stop layer ES and the semiconductor layer of the driving thin film transistor T1 may be arranged on a same layer and include a same material.

In some exemplary embodiments, the etch stop layer ES may include polysilicon or amorphous silicon. In other exemplary embodiments, the etch stop layer ES may include an oxide of at least one material from among indium (In), gallium (Ga), stannum (Sn), zirconium (Zr), vanadium (V), hafnium (Hf), cadmium (Cd), germanium (Ge), chromium (Cr), titanium (Ti), and zinc (Zn). However, exemplary embodiments of the present inventive concepts are not limited thereto. The first gate insulating layer 112, the second gate insulating layer 113, and the third gate insulating layer 114 are sequentially stacked on the etch stop layer ES.

A photoresist (PR) pattern is formed on the third gate insulating layer 114 to form the groove GR. The groove GR may be formed in an area corresponding to the etch stop layer ES.

Figure 6B:
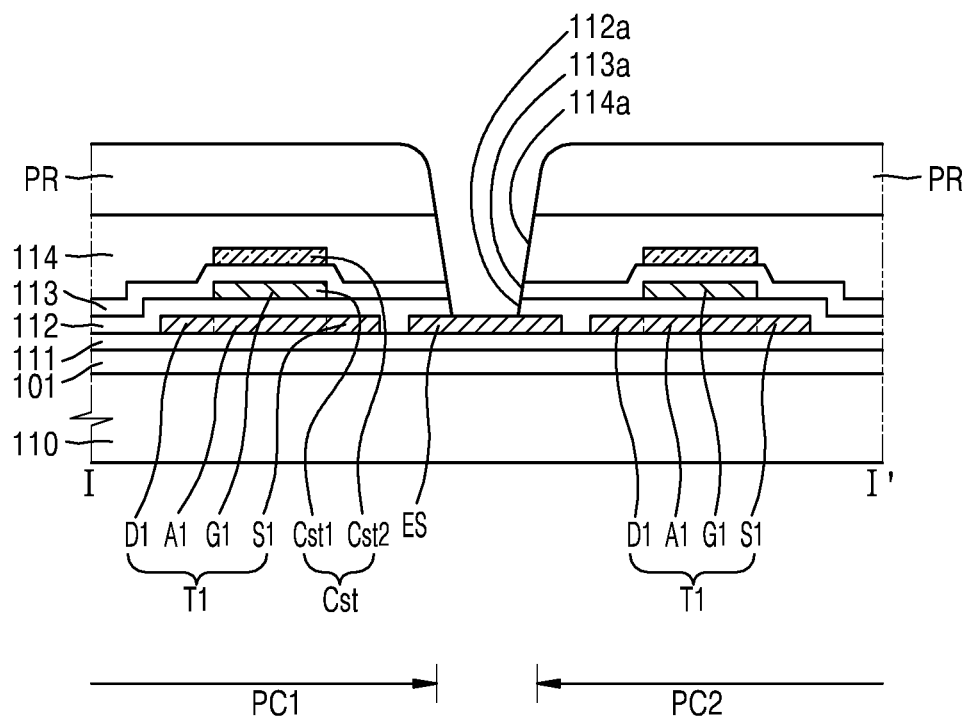

Referring to FIG. 6B, openings 114a, 113a, and 112a are respectively formed by first etching in the third gate insulating layer 114, the second gate insulating layer 113, and the first gate insulating layer 112 by using the PR pattern formed on the third gate insulating layer 114 as a mask. In this embodiment, the first etching may be a dry etching using a fluorinated gas. For example, the gas for the first etching may be a combination gas of carbon tetrafluoride (CF4) and H2, triflupluoromethane (CHF3), hexafluoroethane (C2F6), octafluoropropane (C3F8), octafluorocyclobutane (C4F8), or a combination gas thereof. However, exemplary embodiments of the present inventive concepts are not limited thereto.

Since the third gate insulating layer 114, the second gate insulating layer 113, and the first gate insulating layer 112 include an insulating material such as silicon oxide, silicon nitride, or silicon oxynitride, the third gate insulating layer 114, the second gate insulating layer 113, and the first gate insulating layer 112 may have a same etching condition.

In contrast, since the etch stop layer ES includes a material having a different etching condition from that of the third gate insulating layer 114, the second gate insulating layer 113, and the first gate insulating layer 112, the etch stop layer ES may not be etched according to the first etch condition.

Figure 6C:
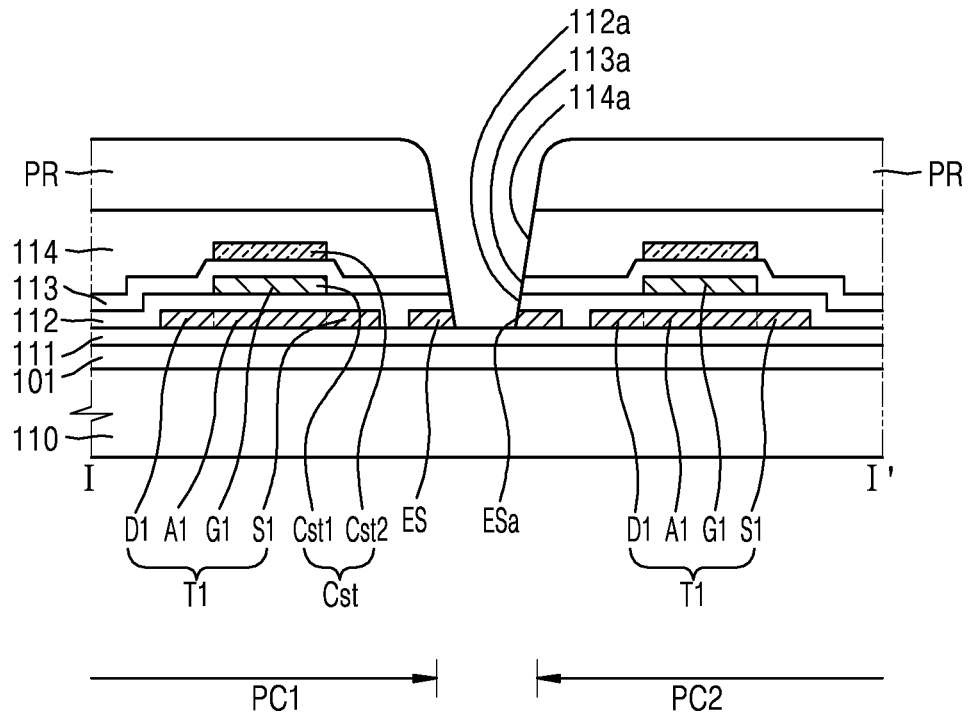

Referring to FIG. 6C, an opening ESa is subsequently formed by etching the etch stop layer ES by a second etching. The second etching may be dry etching using a chloride (CL)-based gas or a combination gas of a chloride-based gas and an oxygen-based gas. However, exemplary embodiments of the present inventive concepts are not limited thereto. In this embodiment, only the etch stop layer ES may react with the second etch condition and be removed.

Figure 6D:
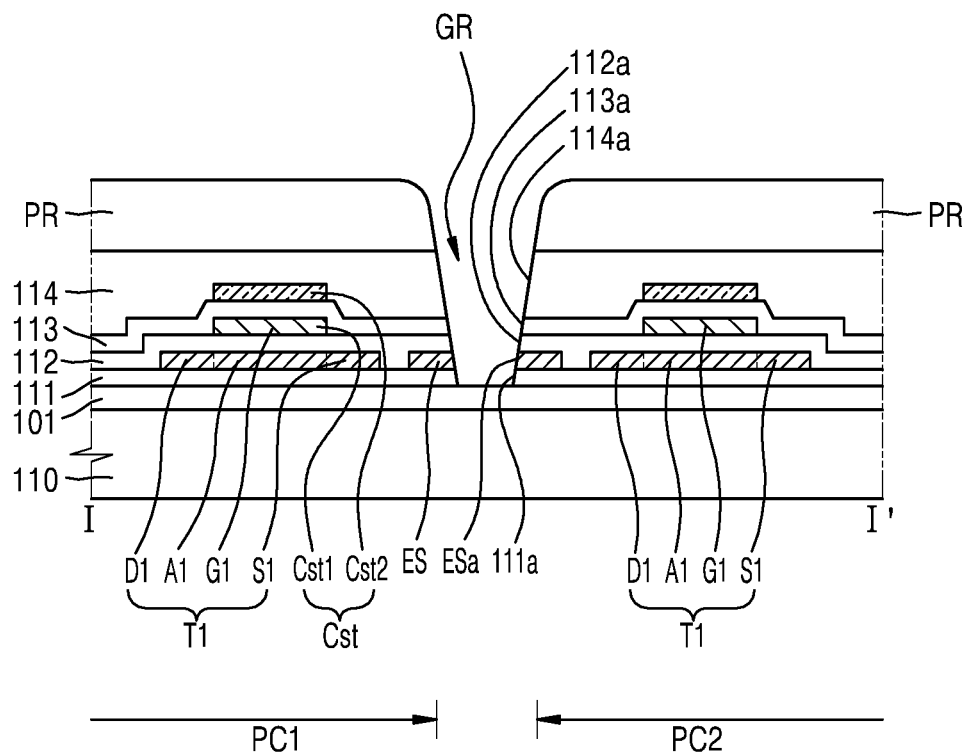

Referring to FIG. 6D, the groove GR is subsequently completed by etching the buffer layer 111 by a third etching and forming an opening 111a that exposes the barrier layer 101. In this embodiment, the third etching may be a dry etching using a fluoride (F)-based gas. For example, a gas for the third etching may be a combination gas of CF4 and H2, CHF3, C2F6. C3F8, C4F8, or a combination gas thereof. However, exemplary embodiments of the present inventive concepts are not limited thereto.

As the thickness of the buffer layer 111 is much thinner than a sum of thicknesses of the first gate insulating layer 112, the second gate insulating layer 113, and the third gate insulating layer 114, an opening of the buffer layer 111 may be easily formed while minimizing the damage due to the third etching to the barrier layer 101.

When the buffer layer 111 through the third gate insulating layer 114 are simultaneously etched without using the etch stop layer ES, the thickness of etching is very large and the rate of over-etching is high. Accordingly, there is a strong risk that the barrier layer 101 will be accidentally etched when etching all of the layers simultaneously. When the barrier layer 101 is etched and an opening is formed in the barrier layer 101, an impurity or moisture may permeate into the barrier layer 101 through the substrate 110 and cause degradation of the semiconductor and the like.

However, the exemplary embodiments of the present inventive concepts include the etch stop layer ES which permits a depth of the groove GR to be precisely adjusted when forming the groove GR. Accordingly, the barrier layer 101 may be prevented from being damaged (e.g., etched) during the process of forming the groove.

Figure 6E:
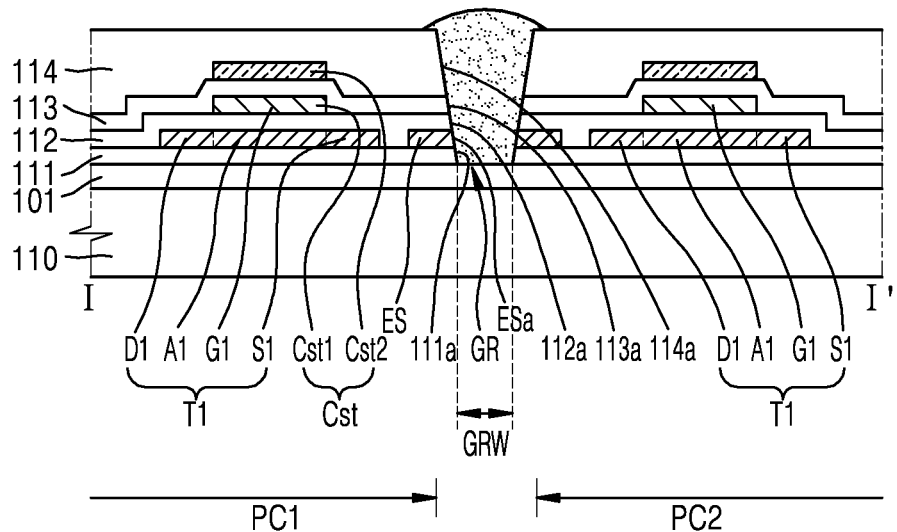

As shown in FIG. 6E, the groove GR is then filled by coating the organic filler 161 on the substrate 110. External shocks applied to the display apparatus may be absorbed by the organic filler 161. The organic filler 161 may include one or more materials from among acryl, metacrylic, polyester, polyethylene, polypropylene, PET, PEN, polycarbonate, PI, PES, polyoxymethylene, polyarylate, and hexamethyldisiloxane. However, exemplary embodiments of the present inventive concepts are not limited thereto.

Figure 6F:
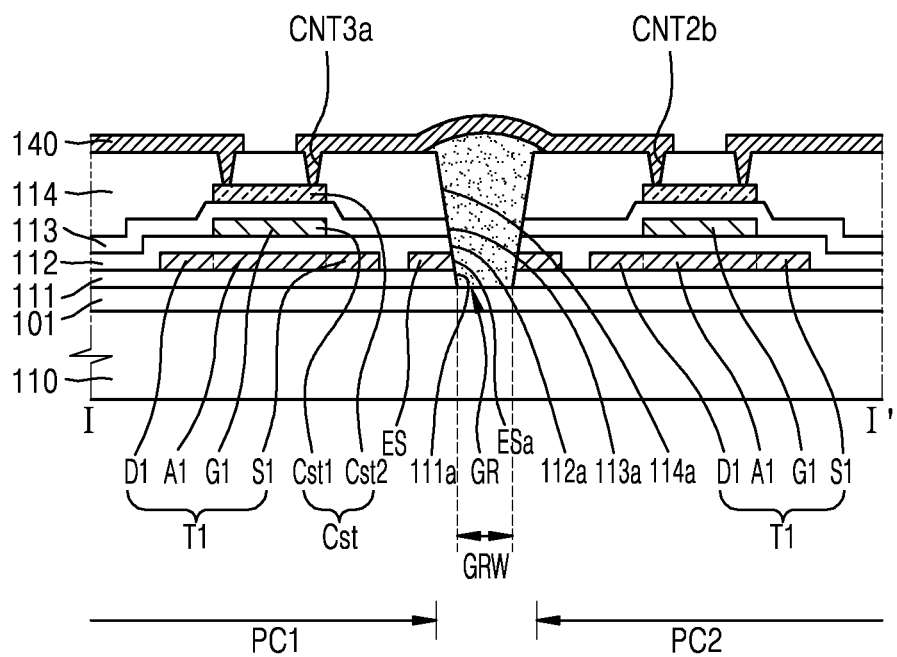

As shown in FIG. 6F, the first connection wiring 140 is then formed on the organic filler 161 and the third gate insulating layer 114. The first connection wiring 140 may be connected to a conductive layer. For example, the first connection wiring 140 may be connected to the second electrode Cst2 of the storage capacitor Cst, that is arranged under the third gate insulating layer, through contact holes CNT3a and CNT2b penetrating the third gate insulating layer 114.

The contact holes CNT3a and CNT2b shown in FIG. 6F may be variously modified. For example, the contact holes CNT3a and CNT2b may be simultaneously formed when the groove GR is formed, or alternatively, may be formed before or after the forming of the groove GR.

The display apparatus according to exemplary embodiments, which includes the inorganic layer that has the groove GR and the organic filler 161 to fill the groove GR in an area between the plurality of pixel circuits and the wirings included in the pixel circuits that are connected by the connection wirings arranged on the organic filler 161, may be utilized to provide a flexible display apparatus.

In addition, the utilization of the etch stop layer ES when forming the groove GR, permits the depth of the groove GR to be finely adjusted. Accordingly, damage to the barrier layer 101 may be minimized.

Figure 7:
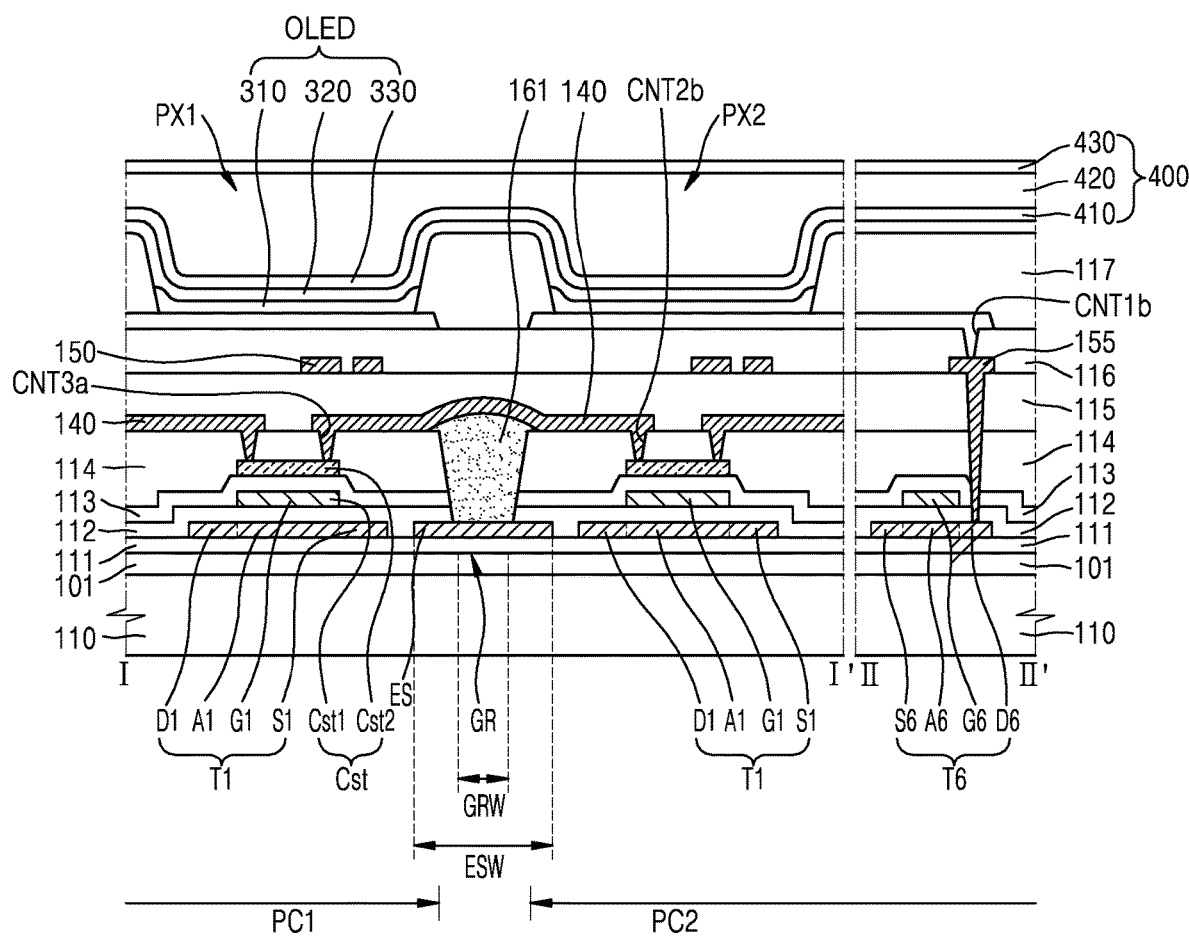
FIG. 7 is a cross-sectional view taken along lines I-I' and II-II' of FIG. 4 according to an exemplary embodiment of the present inventive concepts.

FIG. 7 is a cross-sectional view of a display apparatus taken along lines I-I' and II-II' of FIG. 4 according to another exemplary embodiment. In FIG. 7, as reference numerals identical to those of FIG. 5A indicate the same components, the description thereof will be omitted.

The display apparatus according to the exemplary embodiment of FIG. 7 includes the inorganic material layer having the groove GR in the area between the plurality of pixel circuits PC1 and PC2 and the organic filler 161 that fills the groove GR. In this embodiment, the inorganic material layer includes the insulating material layers 111, 112, 113 and 114, and the etch stop layer ES respectively having different etching conditions, and the etch stop layer ES is provided on the bottom surface or the portion of the side wall of the groove GR.

In the exemplary embodiment of FIG. 7, the etch stop layer ES may form the bottom surface of the groove GR. In other words, the etch stop layer ES may be arranged between the area between the first pixel circuit PC1 and the second pixel circuit PC2, and the groove GR may be formed as an opening of the third gate instating layer 114, the second gate insulating layer 113, and the first gate insulating layer 112. The bottom surface of the groove GR may be between the lowest portion of the first gate insulating layer and the highest portion of the first gate insulating layer.

In the exemplary embodiment shown in FIG. 7, the third gate insulating layer 114, the second gate insulating layer 113, and the first gate insulating layer 112 include an insulating material such as silicon oxide, silicon nitride, and silicon oxynitride, and the etch stop layer ES may include a material that has an etch condition that is different from the etch condition of the insulating material. For example, in an exemplary embodiment, the etch stop layer ES may include a semiconductor layer.

In some exemplary embodiments, the third gate insulating layer 114, the second gate insulating layer 113, and the first gate insulating layer 112 may be etched by a fluorine-based gas, and the etch stop layer ES may be etched by a chloride-based gas.

As described above, the etch stop layer ES protects the barrier layer 101 thereunder from being etched and permeation of a foreign material through the substrate 110 may be minimized by the barrier layer.

The display apparatus according to the exemplary embodiment, which includes the organic filler 161 to fill the groove GR and wirings included in the pixel circuits that are connected by the connection wirings arranged on the organic filler 161, may be utilized to provide a flexible display apparatus.

Figure 8:
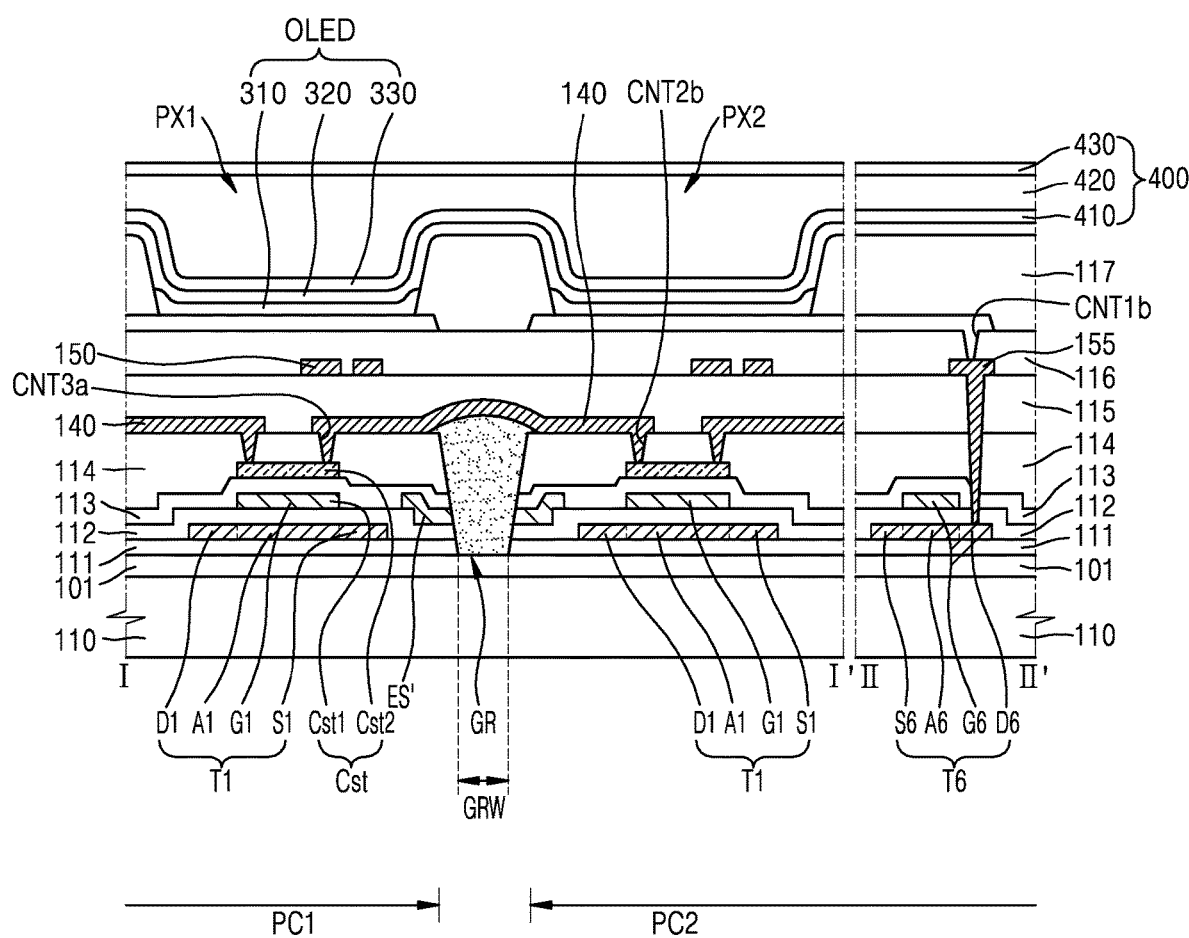
FIG. 8 is a cross-sectional view taken along lines I-I' and II-II' of FIG. 4 according to an exemplary embodiment of the present inventive concepts.

FIG. 8 is a cross-sectional view taken along lines I-I' and II-II' of FIG. 4 according to another exemplary embodiment. In FIG. 8, the same reference numerals as those of FIG. 5A denote the same components and description thereof will be omitted.

The display apparatus according to the exemplary embodiment of FIG. 8 includes the inorganic layer having the groove GR in the area between the plurality of pixel circuits PC1 and PC2 and the organic filler 161 that fills the groove GR. In this embodiment, the inorganic material layer include the insulating material layers 111, 112, 113, and 114, and an etch stop layer ES' respectively having different etch conditions. The etch stop layer ES' is provided on the bottom surface or the portion of the side wall of the groove GR.

Referring to FIG. 8, the etch stop layer ES' and the gate electrodes G1 and G6 may be arranged on a same layer and include a same material. For example, the etch stop layer ES' may be arranged between the first gate insulating layer 112 and the second gate insulating layer 113. In addition, the etch stop layer ES' may include Mo, Cu, Ti, and the like and include a single layer or a multi-layer.

The etch stop layer ES' may form a portion of the side wall of the groove GR. For example, the etch stop layer ES' may form a portion of the side wall of the groove GR that is higher (e.g., in the direction of the thickness of the substrate 110) than a bottom portion of the groove. The etch stop layer ES' may be understood as being arranged to surround the groove GR or the organic filler 161.

In the present exemplary embodiment, the third gate insulating layer 114, the second gate insulating layer 113, and the first gate insulating layer 112 include an insulating material such as silicon oxide, silicon nitride, and silicon oxynitride, and the etch stop layer ES may include a material that has an etch condition different from the etch condition of the insulating material. However, exemplary embodiments of the present inventive concepts are not limited thereto.

In some exemplary embodiments, the third gate insulating layer 114, the second gate insulating layer 113, the first gate insulating layer 112, and the buffer layer 111 may be etched by a fluoride-based gas, and the etch stop layer ES' may be etched by a chloride-based gas. However, exemplary embodiments of the present inventive concepts are not limited thereto.

As described above, damage to the barrier layer 101 under the etch stop layer ES' may be minimized by the etch stop layer ES', and thus, permeation of a foreign material through the substrate 110 may be minimized.

The display apparatus according to the exemplary embodiment, which includes the organic filler 161 to fill the groove GR and wirings included in the pixel circuits that are connected by the connection wirings arranged on the organic filler 161, may be utilized to provide a flexible display apparatus.

Figure 9:
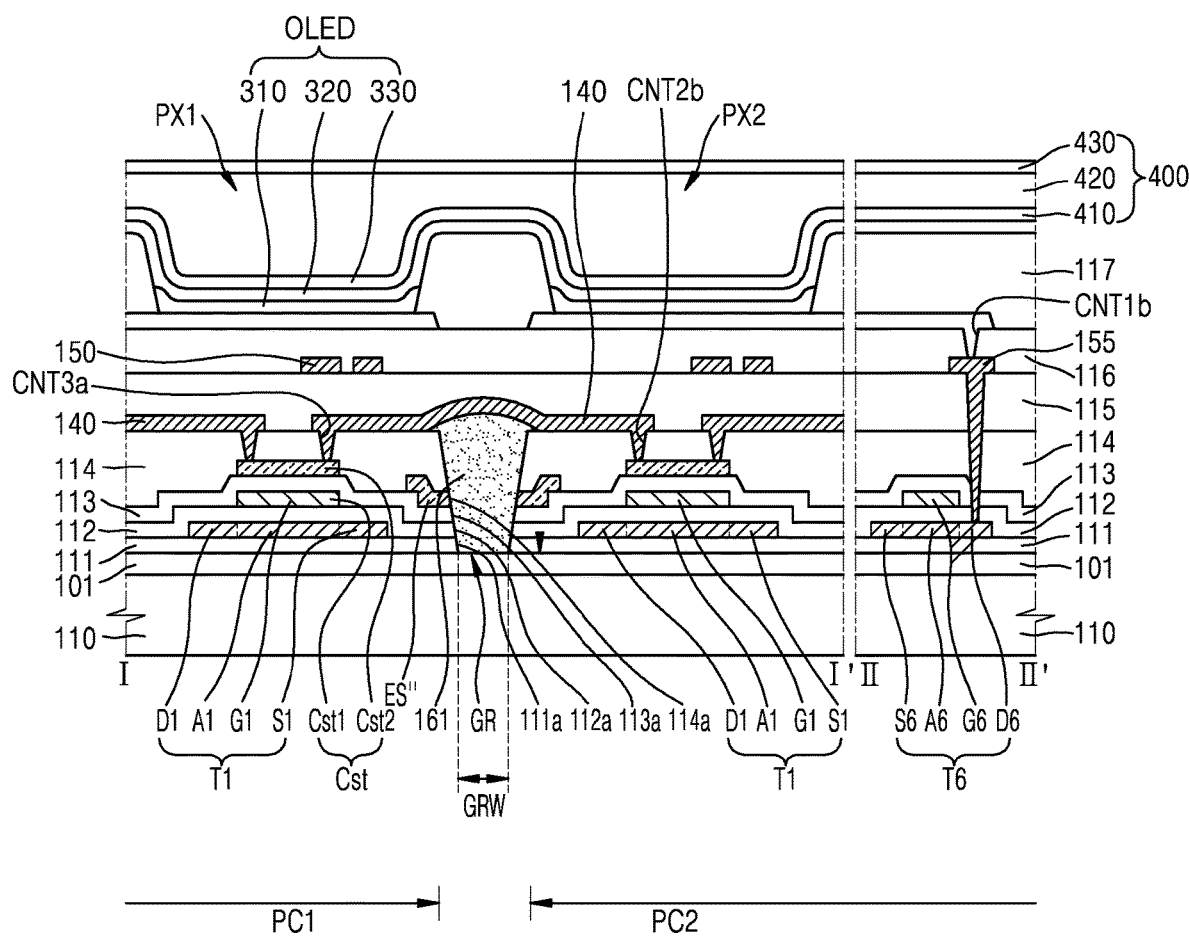
FIG. 9 is a cross-sectional view taken along lines I-I' and II-II' of FIG. 4 according to an exemplary embodiment of the present inventive concepts.

FIG. 9 is a cross-sectional view showing a portion of a display apparatus according to another exemplary embodiment. In FIG. 9, since the same reference numerals as those of FIG. 5A denote the same components, a description thereof will be omitted.

The display apparatus according to the exemplary embodiment of FIG. 9 includes the inorganic material layer having the groove GR in the area between the plurality of pixel circuits PC1 and PC2 and the organic filler 161 that fills the groove GR. The inorganic material layer includes the insulating material layers 111, 112, 113, and 114, and an etch stop layer ES" respectively having different etch conditions, and the etch stop layer ES" is provided on the bottom surface or the portion of the side wall of the groove GR.

In the present exemplary embodiment, the etch stop layer ES" may be arranged on a same layer as the second electrode Cst2 of the storage capacitor Cst and include a same material as the material of the second electrode Cst2 of the storage capacitor Cst. The etch stop layer ES" may be arranged between the second gate insulating layer 113 and the third gate insulating layer 114. In addition, the etch stop layer ES" may include Mo, Cu, Ti, and the like and may include a single layer or a multi-layer.

The etch stop layer ES" may form a portion of the side wall of the groove GR. For example, the etch stop layer ES' may form a mid-portion of the side wall (e.g., in the direction of the thickness of the substrate 110) of the groove GR. The etch stop layer ES" may be understood as being arranged to surround the groove GR or the organic filler 161.

In the present exemplary embodiment, the third gate insulating layer 114, the second gate insulating layer 113, the first gate insulating layer 112, and the buffer layer 112 include an insulating material such as silicon oxide, silicon nitride, and silicon oxynitride, and the etch stop layer ES" may include a material that has an etch condition different from that of the insulating material. However, exemplary embodiments of the present inventive concepts are not limited thereto.

In some exemplary embodiments, the third gate insulating layer 114, the second gate insulating layer 113, the first gate insulating layer 112, and the buffer layer 111 may be etched by a fluoride-based gas, and the etch stop layer ES" may be etched by a chloride-based gas.

As described above, damage to the barrier layer 101 under the etch stop layer ES" may be minimized by the etch stop layer ES", and thus, permeation of a foreign material through the substrate 110 may be minimized. However, exemplary embodiments of the present inventive concepts are not limited thereto.

The display apparatus according to the exemplary embodiment, which includes the organic filler 161 to fill the groove GR and the wirings included in the pixel circuits that are connected by the connection wirings arranged on the organic filler 161, may be utilized to provide a flexible display apparatus.

Figure 10:
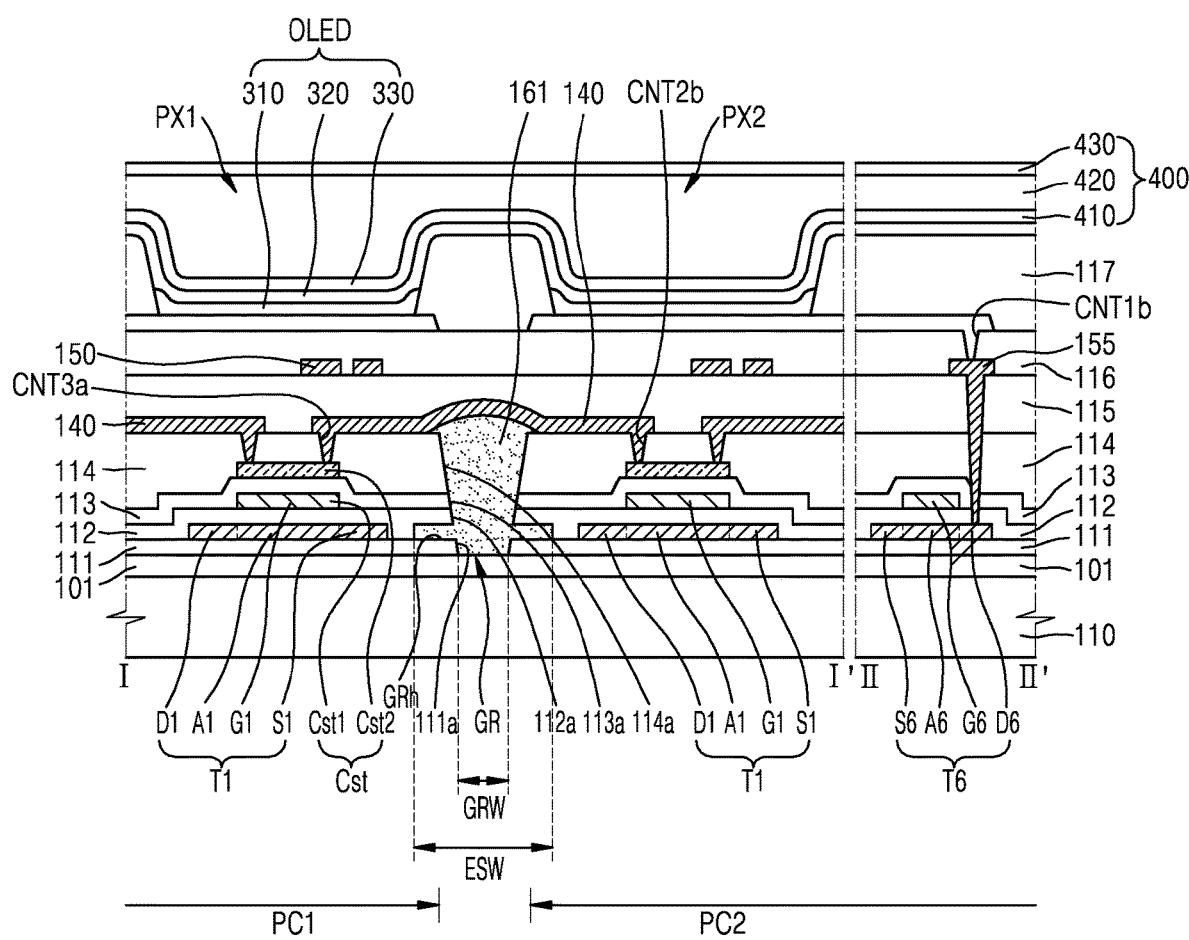
FIG. 10 is a cross-sectional view taken along lines I-I' and II-II' of FIG. 4 according to an exemplary embodiment of the present inventive concepts.

FIG. 10 is a cross-sectional view showing a portion of a display apparatus according to another exemplary embodiment. In FIG. 10, since the same reference numerals as those of FIG. 5A denote same components as those of FIG. 5A, the descriptions thereof will be omitted.

Referring to FIG. 10, the display apparatus according to the exemplary embodiment includes the inorganic material layer having the groove GR in the area between the plurality of pixel circuits PC1 and PC2, and the organic filler 161 that fills the groove GR.

In this embodiment, a recess GRh that extends parallel to the upper surface of the substrate 110 may be provided on the side wall of the groove GR. In FIG. 10, the recess GRh is arranged between the buffer layer 111 and the first gate insulating layer 112. However, exemplary embodiments of the present inventive concepts are not limited thereto. For example, the recess GRh may be arranged between the first gate insulating layer 112 and the second gate insulating layer 113. The recess GRh may also be arranged between the second gate insulating layer 113 and the third gate insulating layer 114.

The recess GRh may be formed by removing the etch stop layer after utilizing the etch stop layer to precisely control the depth of the groove GR. Since the etch stop layer may include a semiconductor material or a metal layer and be etched by a chloride-based gas, the etch stop layer may be completely removed according to an etch condition. Therefore, a recess GRh may be formed in the area in which the etch stop layer has been removed.

The recess may form a portion of the groove GR. Since the groove GR is filled with the organic filler 161, the recess GRh may also be filled with the organic filler 161.

The display apparatus according to the exemplary embodiment, which includes the organic filler 161 to fill the groove GR and the wirings included in the pixel circuits that are connected by the connection wirings arranged on the organic filler 161, may be utilized to provide a flexible display apparatus.

As described above, since the display apparatus according to the exemplary embodiments includes an inorganic material layer having a groove in an area between a plurality of pixels and an organic filler that fills the groove, the display apparatus may be strong and flexible in response to external shocks.

In addition, since the groove includes the etch stop layer, the depth of the groove may be easily controlled.

The scope of the exemplary embodiments is not limited to the above-mentioned advantages.

It should be understood that exemplary embodiments described herein should be considered in a descriptive sense only and not for purposes of limitation. Descriptions of features or aspects within each embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a display area having a plurality of pixel circuits that are spaced apart from each other;
   an inorganic material layer arranged in the display area and having a groove between adjacent pixel circuits of the plurality of pixel circuits; and
   an organic filler disposed in the groove,
   wherein the inorganic material layer comprises at least one insulating material layer and an etch stop layer,
   the etch stop layer comprises a semiconductor material or a conductive material, and
   the etch stop layer is provided on a bottom surface or a portion of a side wall of the groove.

2. The display apparatus of claim 1, wherein:
   the plurality of pixel circuits each include a thin film transistor including a semiconductor layer and a gate electrode; and
   the etch stop layer is provided on a same layer as the semiconductor layer and includes a same material as a material of the semiconductor layer.

3. The display apparatus of claim 1, wherein:
   the plurality of pixel circuits each include a thin film transistor including a semiconductor layer and a gate electrode; and
   the etch stop layer is provided on a same layer as the gate electrode and includes a same material as a material of the gate electrode.

4. The display apparatus of claim 1, wherein:
   each of the plurality of pixel circuits includes a driving thin film transistor and a storage capacitor, the driving thin film transistor and the storage capacitor are arranged to overlap each other; and
   the etch stop layer is provided on a same layer as an electrode of the storage capacitor and includes a same material as a material of the electrode of the storage capacitor.

5. The apparatus of claim 1, wherein:
   the inorganic material layer includes a barrier layer arranged on the substrate; and
   the barrier layer is continuously arranged over the plurality of pixel circuits.

6. The display apparatus of claim 1, wherein the organic filler is arranged to surround at least a portion of the plurality of pixel circuits.

7. The display apparatus of claim 1, wherein the organic filler extends to an upper surface of the inorganic material layer.

8. The display apparatus of claim 1, further comprising a first connection wiring that overlaps the plurality of pixel circuits and is arranged on the organic filler.

9. The display apparatus of claim 8, wherein:
   the adjacent pixel circuits include a first pixel circuit and a second pixel circuit that are adjacent to each other in a first direction;
   a first scanning line of the first pixel circuit is separated from a second scanning line of the second pixel circuit by the organic filler; and
   the first scanning line and the second scanning line are connected to each other by the first connection wiring.

10. The display apparatus of claim 9, wherein an elongation rate of the first connection wiring is greater than elongation rates of the first scanning line and the second scanning line.

11. The display apparatus of claim 9, further comprising:
    an interlayer insulating layer covering the first connection wiring; and
    a second connection wiring arranged on the interlayer insulating layer and configured to connect the plurality of pixel circuits to each other.

12. The display apparatus of claim 11, further comprising:
    an opening in the interlayer insulating layer, the opening exposing the organic filler; and
    an upper-organic filler that is disposed in the opening,
    wherein the first connection wiring and the second connection wiring extend in different directions from each other.

13. The display apparatus of claim 1, wherein the groove is formed by:
    etching the insulating material layer by a fluoride-based gas; and
    etching the etch stop layer by a chloride-based gas.

14. The display apparatus of claim 1, further comprising:
    an encapsulation layer that is configured to seal the display area, the encapsulation layer comprising at least one inorganic encapsulation layer and at least one organic encapsulation layer.

15. The display apparatus of claim 1, wherein an upper surface of the organic filler has a convex shape.

16. A display apparatus comprising:
    a substrate including a display area having a plurality of pixel circuits that are spaced apart from each other;
    an inorganic material layer arranged in the display area and having a groove in an area between adjacent pixel circuits of the plurality of pixel circuits;
    an organic filler disposed in the groove; and
    a recess positioned on a side wall of the groove.

17. The display apparatus of claim 16, wherein:
- the inorganic material layer includes a barrier layer arranged on the substrate; and
- the bather layer is arranged under the groove and continuously arranged over the plurality of pixel circuits.

18. The display apparatus of claim 16, wherein the organic filler is arranged to surround at least a portion of the plurality of pixel circuits.

19. The display apparatus of claim 16, further comprising a first connection wiring that overlaps the plurality of pixel circuits and is arranged on the organic filler.

20. The display apparatus of claim 19, wherein:
- the adjacent pixel circuits include a first pixel circuit and a second pixel circuit that are adjacent to each other in a first direction;
- a first scanning line of the first pixel circuit is separated from a second scanning line of the second pixel circuit by the organic filler; and
- the first scanning line and the second scanning line are connected to each other by the first connection wiring.

* * * * *